(12) United States Patent
Mandalapu et al.

(10) Patent No.: US 12,300,662 B2
(45) Date of Patent: May 13, 2025

(54) DBI TO SI BONDING FOR SIMPLIFIED HANDLE WAFER

(71) Applicant: ADEIA SEMICONDUCTOR BONDING TECHNOLOGIES INC., San Jose, CA (US)

(72) Inventors: Chandrasekhar Mandalapu, Morrisville, NC (US); Gaius Gillman Fountain, Jr., Youngsville, NC (US); Guilian Gao, Campbell, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 18/653,243

(22) Filed: May 2, 2024

(65) Prior Publication Data
US 2024/0282747 A1 Aug. 22, 2024

Related U.S. Application Data

(63) Continuation of application No. 18/464,982, filed on Sep. 11, 2023, which is a continuation of application
(Continued)

(51) Int. Cl.
*H01L 21/78* (2006.01)
*H01L 21/683* (2006.01)
(Continued)

(52) U.S. Cl.
CPC .......... *H01L 24/83* (2013.01); *H01L 21/6836* (2013.01); *H01L 21/78* (2013.01);
(Continued)

(58) Field of Classification Search
CPC . H01L 21/6836; H01L 21/78; H01L 21/6832; H01L 24/83; H01L 24/03;
(Continued)

(56) References Cited

U.S. PATENT DOCUMENTS

| 5,034,343 A | 7/1991 | Rouse et al. |
| 5,753,536 A | 5/1998 | Sugiyama et al. |

(Continued)

FOREIGN PATENT DOCUMENTS

| CN | 107611075 A | 1/2018 |
| JP | 2002-353416 A | 12/2002 |

(Continued)

OTHER PUBLICATIONS

Micro Materials, "Wafer AirDebond®—Air-Assisted Mechanical Debonding", downloaded from https://micromaterials-inc.com/ on Jul. 22, 2024; 8 pages.

(Continued)

*Primary Examiner* — Omar F Mojaddedi
(74) *Attorney, Agent, or Firm* — Knobbe, Martens, Olson & Bear, LLP

(57) ABSTRACT

Devices and techniques include process steps for preparing various microelectronic components for bonding, such as for direct bonding without adhesive. The processes include providing a first bonding surface on a first surface of the microelectronic components, bonding a handle to the prepared first bonding surface, and processing a second surface of the microelectronic components while the microelectronic components are gripped at the handle. In some embodiments, the processes include removing the handle from the first bonding surface, and directly bonding the microelectronic components at the first bonding surface to other microelectronic components.

20 Claims, 13 Drawing Sheets

Related U.S. Application Data

No. 17/209,638, filed on Mar. 23, 2021, now Pat. No. 11,791,307, which is a continuation of application No. 16/386,261, filed on Apr. 17, 2019, now Pat. No. 10,964,664.

(60) Provisional application No. 62/660,509, filed on Apr. 20, 2018.

(51) Int. Cl.
*H01L 23/00* (2006.01)
*H01L 25/065* (2023.01)

(52) U.S. Cl.
CPC .............. *H01L 24/03* (2013.01); *H01L 24/08* (2013.01); *H01L 24/09* (2013.01); *H01L 24/32* (2013.01); *H01L 24/33* (2013.01); *H01L 24/98* (2013.01); *H01L 2221/68327* (2013.01); *H01L 2221/68368* (2013.01); *H01L 2221/68381* (2013.01); *H01L 2224/03002* (2013.01); *H01L 2224/08145* (2013.01); *H01L 2224/09181* (2013.01); *H01L 2224/32145* (2013.01); *H01L 2224/33181* (2013.01); *H01L 2224/80895* (2013.01); *H01L 2224/83009* (2013.01); *H01L 2224/83896* (2013.01); *H01L 2224/83948* (2013.01)

(58) Field of Classification Search
CPC ......... H01L 24/08; H01L 24/09; H01L 24/32; H01L 24/33; H01L 24/98; H01L 24/05; H01L 25/0652; H01L 25/50
See application file for complete search history.

(56) References Cited

U.S. PATENT DOCUMENTS

| | | |
|---|---|---|
| 5,771,555 A | 6/1998 | Eda et al. |
| 5,897,743 A | 4/1999 | Fujimoto et al. |
| 5,985,742 A | 11/1999 | Henley et al. |
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| RE39,484 E | 2/2007 | Bruel |
| 7,193,423 B1 | 3/2007 | Dalton et al. |
| 7,226,812 B2 | 6/2007 | Lu et al. |
| 7,713,840 B2 | 5/2010 | Kelly et al. |
| 7,750,488 B2 | 7/2010 | Patti et al. |
| 7,759,050 B2 | 7/2010 | Kessel et al. |
| 7,795,113 B2 | 9/2010 | Swinnen et al. |
| 7,803,693 B2 | 9/2010 | Trezza |
| 7,910,458 B2 | 3/2011 | Henley |
| 7,932,614 B2 | 4/2011 | Codding et al. |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,461,017 B2 | 6/2013 | Sadaka et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,505,197 B2 | 8/2013 | Blanchard |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,450,115 B2 | 9/2016 | Christensen et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,929,050 B2 | 3/2018 | Lin |
| 9,929,054 B2 | 3/2018 | Yonehara et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,086,584 B2 | 10/2018 | Bellman et al. |
| 10,157,766 B2 | 12/2018 | Kang et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,529,693 B2 | 1/2020 | Agarwal et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |

(56) References Cited

U.S. PATENT DOCUMENTS

| | | |
|---|---|---|
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,274,234 B2 | 3/2022 | Zhang et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,801 B2 | 5/2022 | Uzoh et al. |
| 11,348,898 B2 | 5/2022 | DeLaCruz et al. |
| 11,355,443 B2 | 6/2022 | Huang et al. |
| 11,791,307 B2 | 10/2023 | Mandalapu et al. |
| 2002/0003307 A1 | 1/2002 | Suga |
| 2002/0048906 A1 | 4/2002 | Sakai et al. |
| 2002/0056927 A1 | 5/2002 | Ohuchi et al. |
| 2004/0084414 A1 | 5/2004 | Sakai et al. |
| 2004/0241958 A1* | 12/2004 | Guarini ............ H01L 21/76254 |
| | | 438/455 |
| 2005/0029224 A1 | 2/2005 | Aspar et al. |
| 2006/0057945 A1 | 3/2006 | Hsu et al. |
| 2006/0264004 A1 | 11/2006 | Tong et al. |
| 2007/0111386 A1 | 5/2007 | Kim et al. |
| 2008/0166525 A1 | 7/2008 | Swinnen et al. |
| 2008/0280416 A1 | 11/2008 | Bedell et al. |
| 2009/0152655 A1 | 6/2009 | Laming et al. |
| 2010/0263794 A1 | 10/2010 | George et al. |
| 2011/0092051 A1 | 4/2011 | Moriceau et al. |
| 2013/0137244 A1 | 5/2013 | Kramer et al. |
| 2013/0320556 A1* | 12/2013 | Liu .................... H01L 24/92 |
| | | 438/455 |
| 2014/0011324 A1 | 1/2014 | Liu et al. |
| 2014/0091458 A1 | 4/2014 | Van Gemert et al. |
| 2014/0094079 A1 | 4/2014 | Ito et al. |
| 2014/0175655 A1 | 6/2014 | Chen et al. |
| 2014/0183728 A1 | 7/2014 | Han et al. |
| 2014/0187040 A1* | 7/2014 | Enquist ................ H01L 24/92 |
| | | 438/667 |
| 2014/0213039 A1 | 7/2014 | Lee et al. |
| 2014/0273334 A1 | 9/2014 | Christensen et al. |
| 2014/0312511 A1* | 10/2014 | Nakamura .............. H01L 24/81 |
| | | 438/109 |
| 2015/0064498 A1 | 3/2015 | Tong |
| 2015/0228535 A1 | 8/2015 | Sadaka et al. |
| 2015/0279816 A1* | 10/2015 | Chen .................... H01L 24/80 |
| | | 257/774 |
| 2015/0325810 A1 | 11/2015 | Iwase |
| 2016/0093518 A1 | 3/2016 | Jung et al. |
| 2016/0141260 A1 | 5/2016 | Chang et al. |
| 2016/0163590 A1 | 6/2016 | Jung et al. |
| 2016/0181228 A1 | 6/2016 | Higuchi et al. |
| 2016/0233111 A1 | 8/2016 | Shiota et al. |
| 2016/0326409 A1 | 11/2016 | Tokuyasu et al. |
| 2016/0343682 A1 | 11/2016 | Kawasaki |
| 2016/0343685 A1 | 11/2016 | Lin et al. |
| 2016/0358898 A1 | 12/2016 | Zhou et al. |
| 2017/0004990 A1* | 1/2017 | Kang .................. H01L 21/561 |
| 2017/0018450 A1 | 1/2017 | Tang |
| 2017/0069535 A1 | 3/2017 | Masuko |
| 2017/0092620 A1* | 3/2017 | Haba .................... H01L 23/48 |
| 2017/0179029 A1 | 6/2017 | Enquist et al. |
| 2017/0200756 A1 | 7/2017 | Kao et al. |
| 2018/0012751 A1 | 1/2018 | Kamochi et al. |
| 2018/0138072 A1 | 5/2018 | Andry et al. |
| 2018/0158713 A1 | 6/2018 | Okita et al. |
| 2018/0175012 A1 | 6/2018 | Wu et al. |
| 2018/0182639 A1* | 6/2018 | Uzoh ................. H01L 21/6835 |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204868 A1* | 7/2018 | Kao .................... H01L 23/481 |
| 2018/0219038 A1 | 8/2018 | Gambino et al. |
| 2018/0294241 A1 | 10/2018 | Chen et al. |
| 2018/0301365 A1* | 10/2018 | Kilcoyne .......... H01L 21/30625 |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0351030 A1 | 12/2018 | Goward |
| 2019/0088481 A1* | 3/2019 | Budd ..................... H01L 24/81 |
| 2019/0115277 A1 | 4/2019 | Yu et al. |
| 2019/0131277 A1 | 5/2019 | Yang et al. |
| 2019/0198377 A1 | 6/2019 | Hacker |
| 2019/0198409 A1 | 6/2019 | Katkar et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075553 A1 | 3/2020 | DeLaCruz et al. |
| 2020/0108592 A1 | 4/2020 | Tsao et al. |
| 2020/0118973 A1 | 4/2020 | Wang et al. |
| 2020/0227367 A1 | 7/2020 | Haba et al. |
| 2020/0243380 A1 | 7/2020 | Uzoh et al. |
| 2020/0243481 A1 | 7/2020 | Chung et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0388503 A1 | 12/2020 | Uzoh et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | DeLaCruz et al. |
| 2021/0233889 A1 | 7/2021 | Mandalapu et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0008039 A1 | 1/2023 | Uzoh et al. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |

(56) References Cited

U.S. PATENT DOCUMENTS

| | | |
|---|---|---|
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0186284 A1 | 6/2024 | Mandalapu et al. |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |

FOREIGN PATENT DOCUMENTS

| | | |
|---|---|---|
| JP | 2013-033786 A | 2/2013 |
| JP | 2014-508405 A | 4/2014 |
| JP | 2018-160519 | 10/2018 |
| KR | 10-1128135 | 3/2012 |
| WO | WO 2005/038865 A2 | 4/2005 |
| WO | WO 2005/043584 A2 | 5/2005 |
| WO | WO 2015/113020 A1 | 7/2015 |

OTHER PUBLICATIONS

Navarro E., "Direct Wafer Bonding Dynamics", Mechanics; Doctoral dissertation, Universite Grenoble Alpes; 2014; NNT:2014GRENI023. tel-01048574v2, downloaded from https://theses.hal.science/tel-01048574/document; 116 pages.

Park H.L., International Preliminary Report on Patentability for PCT/US2022/022674, dated Jul. 25, 2022 (7 pages).

"An Overview of Temporary Wafer Bonding Processes," Processing Theories, https://www.brewerscience.com/processing-theories/temporary-bonding/, downloaded Aug. 23, 2022, 11 sheets.

Bush, Steve, "Electronica: Automotive power modules from On Semi," ElectronicsWeekly.com, indicating an OnSemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

International Search Report and Written Opinion for PCT/US2019/028005, dated Aug. 9, 2019, 13 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Monk et al., "Hydrofluoric etching of silicon dioxide sacrificial layers," J. ElectroChem. Soc., 1994, vol. 141, pp. 270-274.

Moriceau, H. et al., "Overview of recent direct wafer bonding advances and applications," Adv Nat Sciences: Nanoscience and Nanotechnology, Dec. 2010;1(4):043004; 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412.

OnSemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "OnSemi AR0820."

Photo-polymer mass transfer, Terecircuits webpage, www.terecircuits.com/process, downloaded Aug. 23, 2022, 4 pages.

Plössl, A. et al., "Wafer direct bonding: tailoring adhesion between brittle materials," Materials Science and Engineering: R: Reports. Mar. 10, 1999;25(1-2):1-88.

Smart cut, Wikipedia entry, https://en.wikipedia.org/wiki/Smart_cut, 2 sheets.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Theil, Jeremy A., "Fluorinated amorphous carbon films for low permittivity interlevel dielectrics," J. Vac. Sci. Technol. B, Nov./Dec. 1999, vol. 17, No. 6, pp. 2397-2410.

Theil, Jeremy A. et al., "The effect of thermal cycling on a-C:F,H low dielectric constant films deposited by ECR plasma enhanced chemical vapor deposition," Appears in the Proceedings of the International Interconnect Technology Conference (IITC), 1998, pp. 128-130.

Theil, Jeremy A. et al., "Thermal stability of a-C:F,H films deposited by electron cyclotron resonance plasma enhanced chemical vapor deposition," Presented at Symposium N of the Spring 1997 MRS Meeting, 1997, 6 pages.

\* cited by examiner

DBI TO SI BONDING FOR SIMPLIFIED HANDLE WAFER

PRIORITY CLAIM AND CROSS-REFERENCE TO RELATED APPLICATION

This application is a continuation of U.S. patent application Ser. No. 18/464,982, filed Sep. 11, 2023, which is a continuation of U.S. patent application Ser. No. 17/209,638, filed Mar. 23, 2021, which is a continuation of U.S. patent application Ser. No. 16/386,261, filed Apr. 17, 2019, which claims priority under 35 U.S.C. § 119(e)(1) to U.S. Provisional Application No. 62/660,509, filed Apr. 20, 2018, each of which is hereby incorporated by reference in their entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety). Respective mating surfaces of the bonded dies or wafers often include embedded conductive interconnect structures, or the like. In some examples, the bonding surfaces are arranged and aligned so that the conductive interconnect structures from the respective surfaces are joined during the bonding. The joined interconnect structures form continuous conductive interconnects (for signals, power, etc.) between the stacked dies or wafers.

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology (i.e., nanometer scale variance), so that the surfaces can be closely mated to form a lasting bond.

Double-sided dies can be formed and prepared for stacking and bonding, where both sides of the dies will be bonded to other substrates or dies, such as with multiple die-to-die or die-to-wafer applications. Preparing both sides of the die includes finishing both surfaces to meet dielectric roughness specifications and metallic layer (e.g., copper, etc.) recess specifications. For instance, conductive interconnect structures at the bonding surfaces may be slightly recessed, just below the insulating material of the bonding surface. The amount of recess below the bonding surface may be determined by a dimensional tolerance, specification, or physical limitation of the device or application. The hybrid surface may be prepared for bonding with another die, wafer, or other substrate using a chemical mechanical polishing (CMP) process, or the like.

A handle wafer can be used to hold the die during the processing steps, which may be temporarily glued to one side of the die during processing and removed afterwards. However, adhesive bonding often does not provide the uniformity necessary for precise thinning of wafers to silicon thicknesses of 1 to 1 Oum, nor does it typically allow for processing at temperatures above 250 C. Additionally, the adhesive layer is typically too compressible to support adequate planarization by chemical mechanical polishing (CMP).

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

SUMMARY

Figure 1:
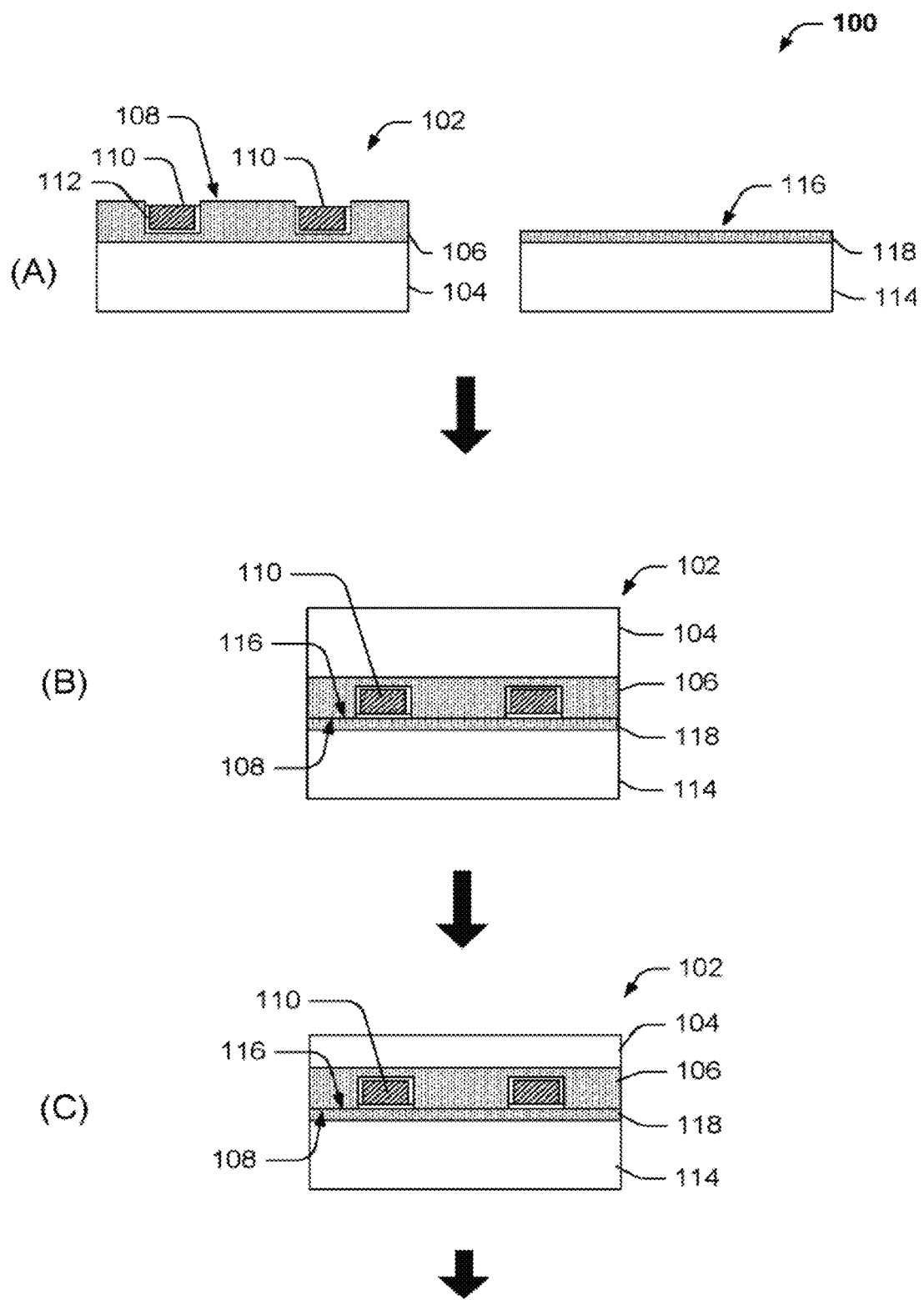
FIGS. 1-3 show an example graphical flow diagram illustrating an example process using a handle wafer in preparing dies for bonding, according to an embodiment.

Representative techniques and devices are disclosed, including process steps for preparing various microelectronic components for bonding, such as for direct bonding without adhesive. The processes include providing a first bonding surface on a first surface of the microelectronic components, bonding a handle to the prepared first bonding surface, and processing a second surface of the microelectronic components while the microelectronic components are gripped at the handle. In some embodiments, the processes include removing the handle from the first bonding surface, and directly bonding the microelectronic components at the first bonding surface to other microelectronic components.

In various implementations, a microelectronic assembly comprises a first substrate including a first bonding surface with a planarized topography having a first predetermined maximum surface variance and a second substrate having a bonding surface with a planarized topography. The second substrate is bonded to the first bonding surface of the first substrate using a direct dielectric-to-dielectric, non-adhesive technique to form a handle. The second substrate is arranged to support the first substrate while a second surface of the first substrate, opposite the first surface, is processed. In one example, the second surface is planarized to form a second bonding surface of the first substrate, having a second predetermined maximum surface variance, while the first substrate is gripped at the handle.

In an implementation, the first bonding surface of the first substrate comprises a dielectric and includes one or more conductive interconnects. In another implementation, the second substrate comprises silicon.

In various implementations, a method of forming a microelectronic assembly comprises preparing a first bonding surface of a first substrate, including planarizing the first bonding surface to have a first predetermined maximum surface variance and depositing a second substrate onto the first bonding surface to form a handle, and processing a second surface of the first substrate, opposite the first surface, while the first substrate is gripped at the handle. In an embodiment, the method includes planarizing the second surface to form a second bonding surface having a second predetermined maximum surface variance. In another embodiment, the method includes direct bonding the second substrate to the first bonding surface using a direct dielectric-to-dielectric, non-adhesive bonding technique. In a further embodiment, the method includes removing the handle and singulating the first substrate into a plurality of microelectronic dies.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

Patterned metal and oxide layers are frequently provided on a die, wafer, or other substrate (hereinafter "die") as a hybrid bonding, or DBI®, surface layer. In the case of double-sided dies, a patterned metal and oxide layer with a prepared bonding surface may be provided on both sides of the die. The oxide is typically highly planar (usually to nm-level roughness) with the metal layer (e.g., embedded conductive features) at or recessed just below the oxide surface. The amount of recess below the oxide is typically determined by a dimensional tolerance, specification, or physical limitation. The bonding surfaces are often prepared for direct bonding with another die, wafer, or other substrate using a chemical-mechanical polishing (CMP) step and/or other preparation steps.

When processing thin wafers of thicknesses below 200 um, often a handle wafer of some description is attached to the device wafer for the purpose of handling the wafer without breakage. This is particularly true when the backside of the wafer is to be processed for the purpose of wafer stacking and bonding. For many applications it is desirable to process the wafers at thicknesses of only a few microns of silicon thickness and many times at higher temperatures above 250 C.

However, bonding a handle wafer to the device wafer using adhesive often does not provide the uniformity necessary for precise thinning of device wafers to silicon thicknesses of 1 to 1 Oum, nor does it typically allow for processing at temperatures above 250 C. The adhesive layer is typically too compressible to support adequate planarization by chemical mechanical polishing (CMP).

The devices and techniques disclosed herein describe bonding a handle wafer to the device wafer using direct bonding techniques to allow for uniformity in processing the bonding surfaces of the dies, processing the dies at temperatures above 250 C, providing adequate support for CMP planarization, and so forth. The handle wafer facilitates handling of the die during processing steps, and can be selectively removed when it is no longer needed. In various implementations, the handle wafer is directly bonded to one of the prepared bonding surfaces. The use of direct bonding techniques rather than an adhesive to attach the handle to the device wafer means that the selective removal process leaves a prepared bonding surface on the device wafer.

FIGS. 1-13 illustrate representative devices and processes for preparing various microelectronic components (such as dies 302, for example) for bonding, such as for direct bonding without adhesive. The processes include providing a first bonding surface (such as first bonding surface 108, for example) on a first surface the microelectronic components (which may be part of a device wafer 102 or other substrate), including providing first conductive interconnect features 110 or structures embedded into the first bonding surface, bonding a handle (such as handle wafer 114, for example) to the prepared first bonding surface, providing a second bonding surface (such as second bonding surface 202, for example) on a second surface of the microelectronic components, including providing second conductive interconnect features 110' or structures embedded into the second bonding surface, removing the handle from the first bonding surface, and forming microelectronic assemblies by directly bonding the microelectronic components at the bonding surfaces, and so forth.

The order in which the processes are described is not intended to be construed as limiting, and any number of the described process blocks in the processes can be combined in any order to implement the processes, or alternate processes. Additionally, individual blocks may be deleted from any of the processes without departing from the spirit and scope of the subject matter described herein. Furthermore, the processes can be implemented in any suitable hardware, software, firmware, or a combination thereof, without departing from the scope of the subject matter described herein. In alternate implementations, other techniques may be included in the processes in various combinations and remain within the scope of the disclosure.

Example Embodiments

Figure 2:
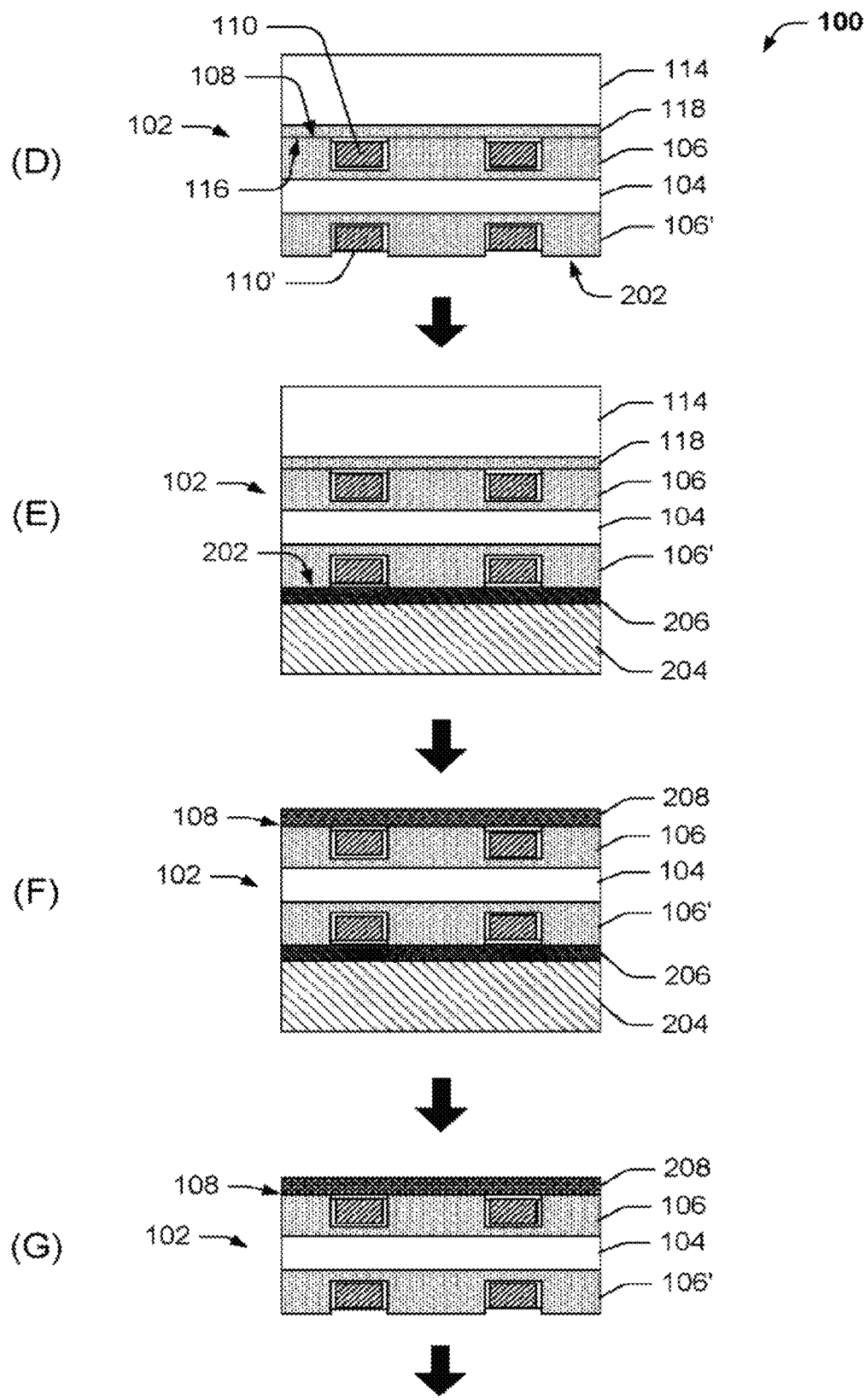
Figure 3:
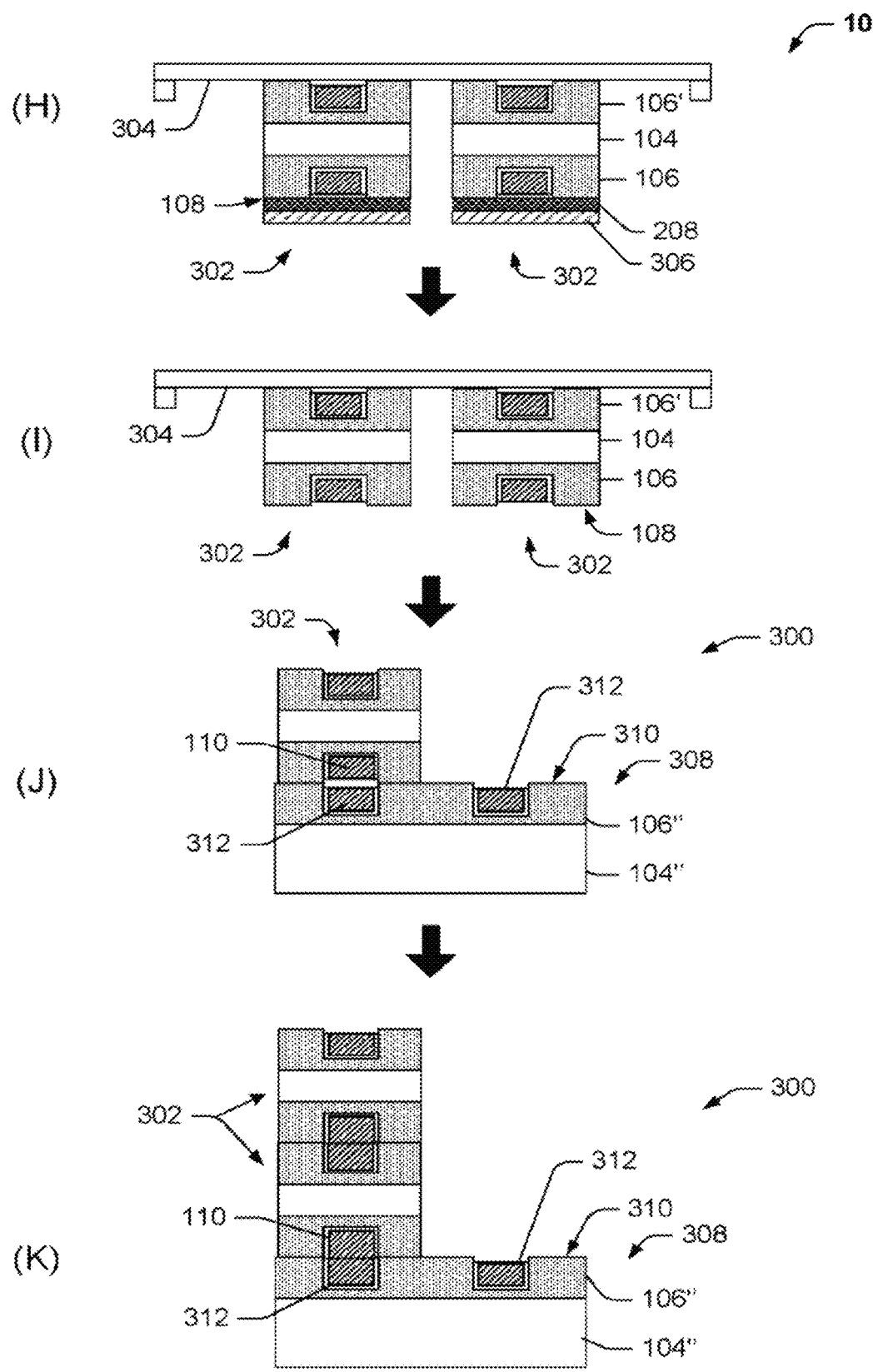

Referring to FIGS. 1-3, in the process 100, a representative device wafer 102 (e.g., wafer, substrate, die, etc.) may be formed using various techniques, to include a base substrate 104 and an insulating or dielectric layer 106. The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like as well as combinations thereof.

As shown at block A, a bonding surface 108 of the device wafer 102 can include conductive features 110, such as traces, pads, and interconnect structures, for example, embedded into the insulating layer 106 and arranged so that the conductive features 110 from respective bonding surfaces 108 of opposing devices can be mated and joined during bonding, if desired. The joined conductive features 110 can form continuous conductive interconnects (for signals, power, etc.) between stacked devices.

Damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. In some examples, a barrier layer 112 may be deposited in the cavities for the conductive features 110 prior to depositing the material of the conductive features 110, such that the barrier layer 112 is disposed between the conductive features 110 and the insulating layer 106. The barrier layer 112 may be comprised of tantalum, for example, or another conductive material, to prevent or reduce diffusion of the material of the conductive features 110 into the insulating layer 106.

The conductive features 110 may be embedded in the insulating layer 106 to provide an electrical and/or thermal path or may instead be configured to balance out the metallization of the bonding surface 108, through the use of additional pads or so-called dummy pads, traces, patterns or the like. After the conductive features 110 are formed, the exposed surface of the device wafer 102, including the insulating layer 106 and the conductive features 110 can be planarized (e.g., via CMP) to form a flat bonding surface 108.

Forming the bonding surface 108 includes finishing the surface 108 to meet dielectric roughness specifications and metallic layer (e.g., copper, etc.) recess specifications, to prepare the surface 108 for direct bonding. In other words, the bonding surface 108 is formed to be as flat and smooth as possible, with very minimal surface topology variance. Various conventional processes, such as chemical mechanical polishing (CMP), dry or wet etching, and so forth, may be used to achieve the low surface roughness. This process provides the flat, smooth surface 108 that results in a reliable bond.

In some cases, as shown in FIG. 1, the exposed surface of the conductive features 110 may be intentionally recessed relative to the bonding surface 108 to allow for material expansion, particularly during heated annealing, if it is to be performed. In other cases, the exposed surface of the conductive features 110 may be formed to exceed the recess specification, and may protrude above the bonding surface 108 to allow for oxidation of the conductive features 110 during later processing. This may be accomplished by selective etching of the dielectric layer 106, for example.

During polishing or other process steps, the surface of the conductive features 110 at the bonding layer 108 may become oxidized (or the like), which may result in their becoming out of the desired specification. The conductive features 110 may be selectively etched, touch polished, or the like, to remove oxidation and improve the subsequent bonding and electrical connection, including restoring a desired recess relative to the bonding surface 108.

After preparation, the first bonding surface 108 of the device wafer 102 may be bonded to another support wafer 114 (e.g., a "silicon carrier," "handle wafer," or the like) for fabrication of the second (i.e., back side) bonding surface 202. For instance, the addition of the handle wafer 114 assists in handling the device wafer 102 during second-side processing, particularly when the device wafer 102 is thin, or is thinned during processing. A handle wafer 114 may comprise a silicon substrate, similar to the base layer 104, or the like. A handle wafer 114 with a similar coefficient of thermal expansion (CTE) as the base layer 104 can help to control warpage during processing, particularly when the devices are heated during processing. Though reference is made herein to a handle wafer, the handle is not limited to the form of a wafer, such as a silicon wafer. The handle may alternatively be provided as a panel, die, or other form and/or material to accommodate various sized substrates 104.

As shown at block A, the bonding surface 116 of the handle wafer 114 can be prepared by depositing an insulating layer 118 on the handle wafer 114. The insulating layer 118 may be comprised of an inorganic dielectric material layer such as oxide, nitride, oxynitride, oxycarbide, carbides, carbonitrides, diamond, diamond like materials, glasses, ceramics, glass-ceramics, and the like as well as combinations thereof (e.g., the insulating layer 118 may be partly or entirely comprised of the same material(s) as the insulating layer 106, but need not be). The bonding surface 116 is planarized (using CMP, or the like) to achieve a highly planar surface, for a reliable direct bond with the device wafer 102. In an embodiment, one or both of the bonding surface 108 and the bonding surface 116 (e.g., the insulating layer 118, if present) may be plasma activated in preparation for bonding.

As shown at block B, the process 100 includes bonding the handle wafer 114 to the device wafer 102, by directly bonding the bonding surface 116 of the handle 114 (on the insulating layer 118, if present) to the bonding surface 108 of the device wafer 102, without the use of adhesive. In some examples, the bonding is performed at ambient or "room temperature" (e.g., less than 90° C.) conditions. In other examples, the bonded assembly may be heat annealed to strengthen the bond. The added sacrificial handle 114 provides mechanical support for very thin active dies (e.g., <<50 um). The handle 114 can also preserve a DBI metallic layer (e.g., copper) during high temperature processing, for instance, approximately 300 degrees C. for 2 hours, or the like.

As shown at block C, prior to forming and polishing the second bonding surface 202, the base layer 104 may be thinned, and any through silicon vias (TSVs) exposed and planarized. By using direct bonding to attach the handle wafer 114 to the device wafer 102, very precise thinning of the device wafer 102 can be achieved, and the bonded pair can be processed at temperatures above 250 C. In an embodiment, the base layer 104 is thinned to have a thickness of less than 20 microns and a total thickness variation (TTV) of less than 3 microns. In other embodiments, the thickness of the base layer 104 and the TTV may have somewhat greater dimensions.

Referring to FIG. 2, as shown at block D, with the handle wafer 114 in place, the second bonding surface 202 on the back side of the device wafer 102 can then be deposited, formed, and finished to meet maximum dielectric roughness specifications and metallic layer (e.g., copper, etc.) recess specifications with minimal surface topology variance, as described above. For instance, an insulating layer 106' can be deposited onto the back side of the device wafer 102, and conductive features 110' embedded therein, if desired. The second bonding surface 202 including the insulating layer 106' (and the conductive features 110') is planarized in preparation for direct bonding.

At block E, a temporary carrier 204 may be attached to the second bonding surface 202, for instance with a temporary adhesive 206, or the like.

As shown at block F, the handle wafer 114 can be subsequently thinned and selectively removed using a variety of techniques, including but not limited to back grinding, chemical mechanical polishing (CMP), dry etching, and wet chemical etching, or a combination thereof. In some cases, the insulating (e.g., oxide) layer 118 of the handle wafer 114 can be removed with a different technique (e.g., different chemical and/or mechanical processes or techniques) than the base layer 114 (which may be comprised of silicon, for instance). The first bonding surface 108, including the insulating layer 106 and any conductive layers (such as conductive features 110, for example) is revealed when the handle wafer 114 is removed. In various examples, the first bonding surface 108 may be ready for direct bonding without further processing. In other examples, some preparation steps (e.g., polishing, cleaning, rinsing, activation, etc.) may be performed prior to bonding.

In some cases a protective coating 208 may be applied to the polished first 108 or second 202 bonding surfaces for protection during processing. In one example, as shown at block F, the protective coating 208 may be applied to the exposed first bonding surface 108 after the handle wafer 114 is removed. The protective coating 208 can preserve the first bonding surface 108, including the insulating layer 106 and any conductive features 110 for future direct or hybrid bonding steps after the handle wafer 114 has been etched, dissolved, ground off, or otherwise removed from the first bonding surface 108. In some embodiments, the protective coating 208 may comprise a photoresist, a polymer coating, or the like.

As shown at block G, after both sides of the device wafer 102 are completed, the temporary carrier 204 and temporary bonding material 206 can be removed. At block H (see FIG. 3), the finished double-sided device wafer 102 may then be mounted to a dicing tape 304 held in a dicing frame and singulated to form a quantity of double-sided dies 302. The device wafer 102 may be singulated into dies 302 by plasma dicing, saw dicing, stealth dicing, or other techniques. Optionally, the dies 302 may be transferred to a grip ring in preparation for bonding. In an implementation, the dies 302 may be cleaned (or undergo other processing) while mounted to the dicing frame or the grip ring.

In some embodiments, more than one type of protective layer may be applied to the bonding surface(s) 108 and/or 202 prior to or after singulation. For example (shown at block H), a first protective layer 208 may comprise a hydrophobic protective layer and overlaying the hydrophobic layer 208 may be a hydrophilic protective layer 306. The underlying hydrophobic layer 208 allows for the use of aggressive etching chemicals during cleaning of the side surfaces of the dies 302 (after singulation) and also increases the shelf life of the prepared bonding surfaces 108 and/or 202.

The overlying hydrophilic layer 306 receives or may be impregnated with particles, debris, dicing tape, adhesive, etc. generated during the dicing process. The hydrophilic layer 306, along with the particles and debris, is removed. In other words, the particles and debris are carried off with the removal of the hydrophilic layer 306. In some cases, the hydrophobic layer 208 may temporarily remain on the dies 302 to protect the surface(s) 108 and/or 202 during subsequent processing or storage. However, the hydrophobic layer 208 (or any remaining protective coatings) can be removed prior to bonding, as shown at block I.

At block J, the process 100 includes stacking and bonding the singulated dies 302 to a prepared host die, wafer, substrate 308, or the like, using a pick and place device, or the like. Preparing the host substrate 308 can include depositing and forming a bonding surface 310 on a surface of the substrate 308, including providing conductive features 312, or the like, and forming a highly planar surface topology, comprising an insulating layer 106" over a base layer 104", as described above.

In some cases, the bonding surface 108 and/or the bonding surface 310 may be plasma treated to enhance direct bonding. Additional dies 302 may be stacked and bonded to the substrate 308 or to the previously bonded die 302, as shown at block K. Further, once the die(s) 302 are stacked and bonded as desired, the assembly 300 may be heat annealed to further bond the conductive features 110 and 312. Of course, it will be appreciated that dies 302 may be stacked prior to being bonded to substrate 308. Moreover, the heat annealing may be implemented after each bonding step or once all of the dies and substrates are stacked.

Figure 4:
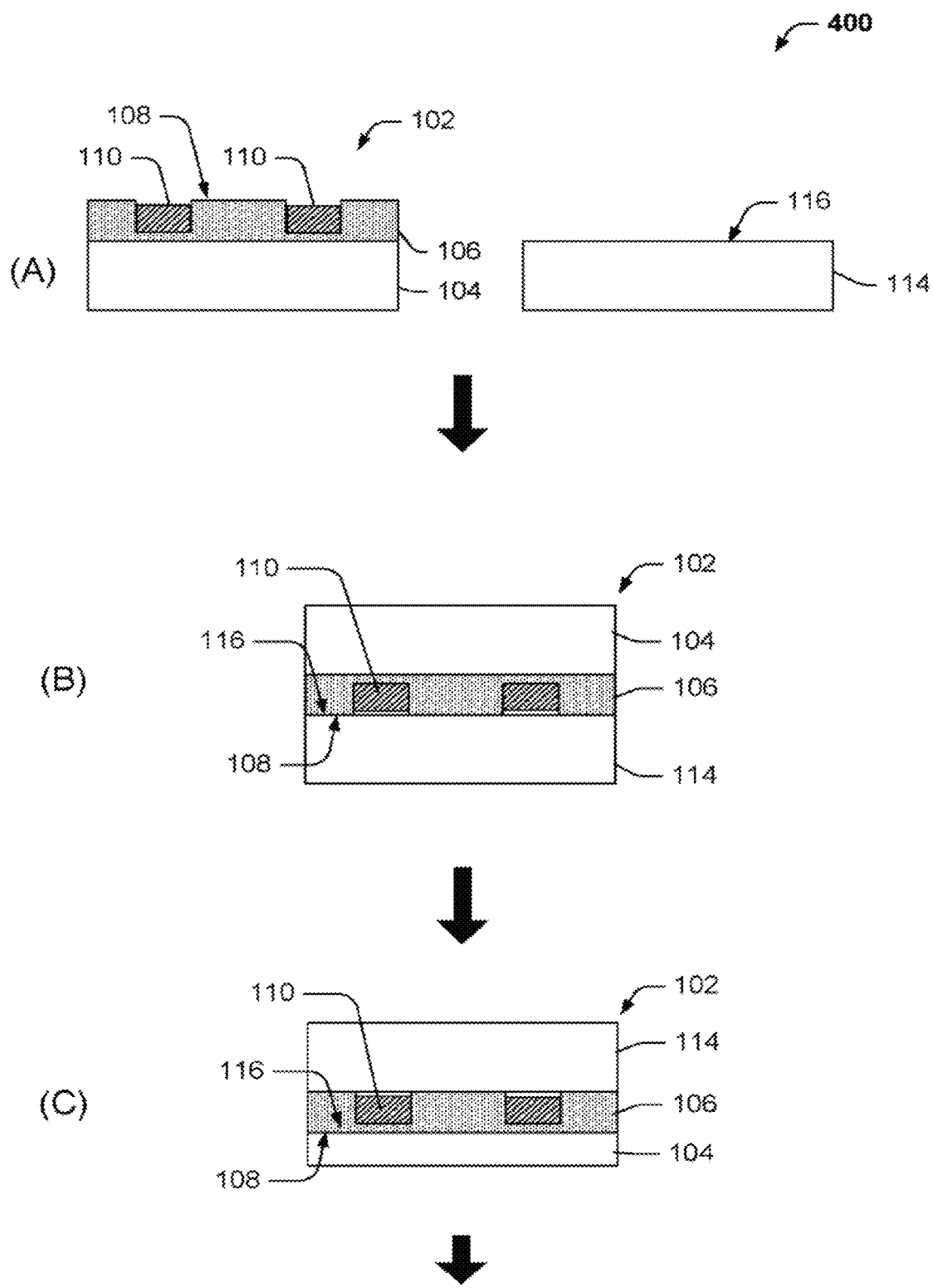
FIGS. 4-6 show an example graphical flow diagram illustrating another example process using a handle wafer in preparing dies for bonding, according to an embodiment.
Figure 5:
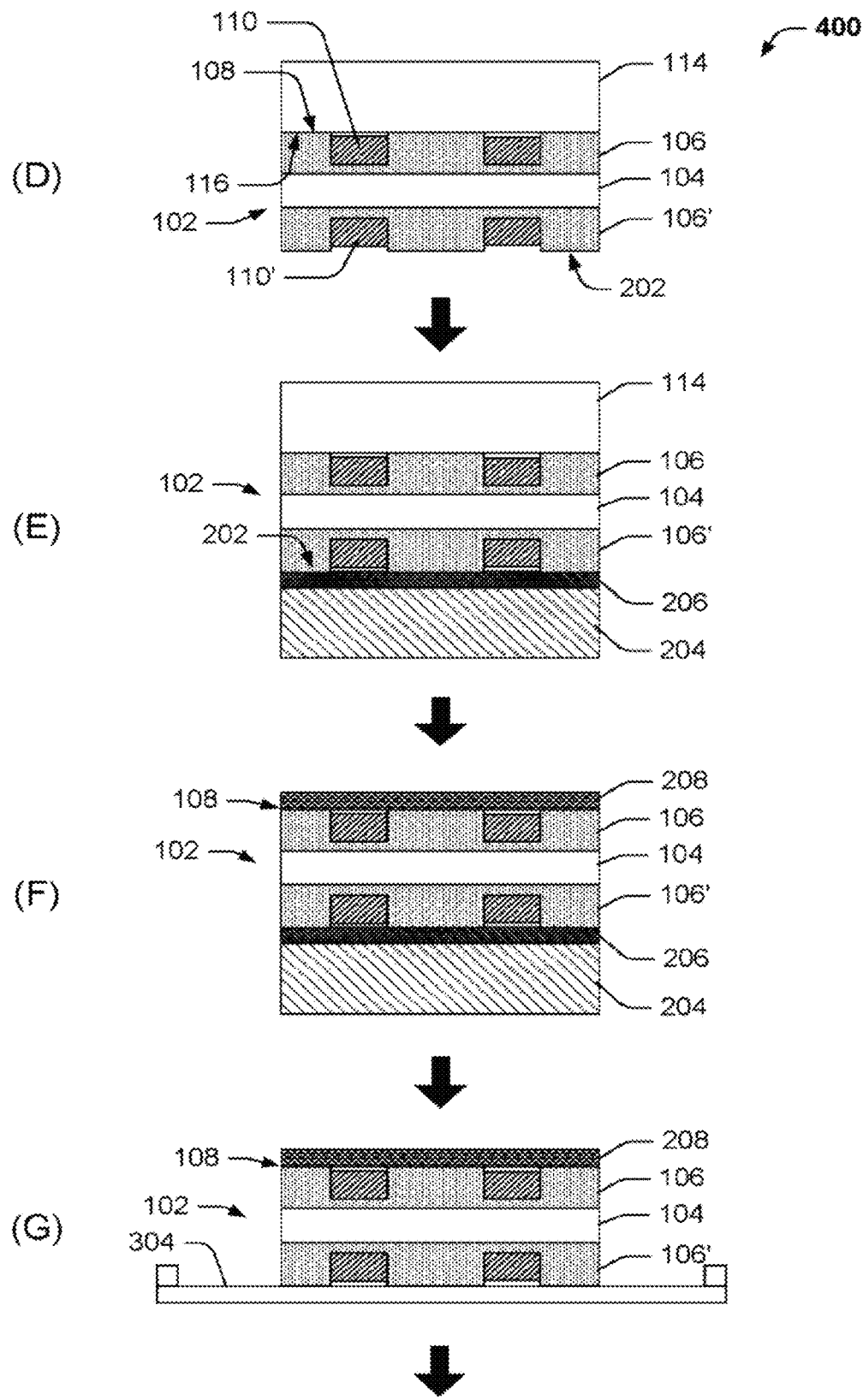
Figure 6:
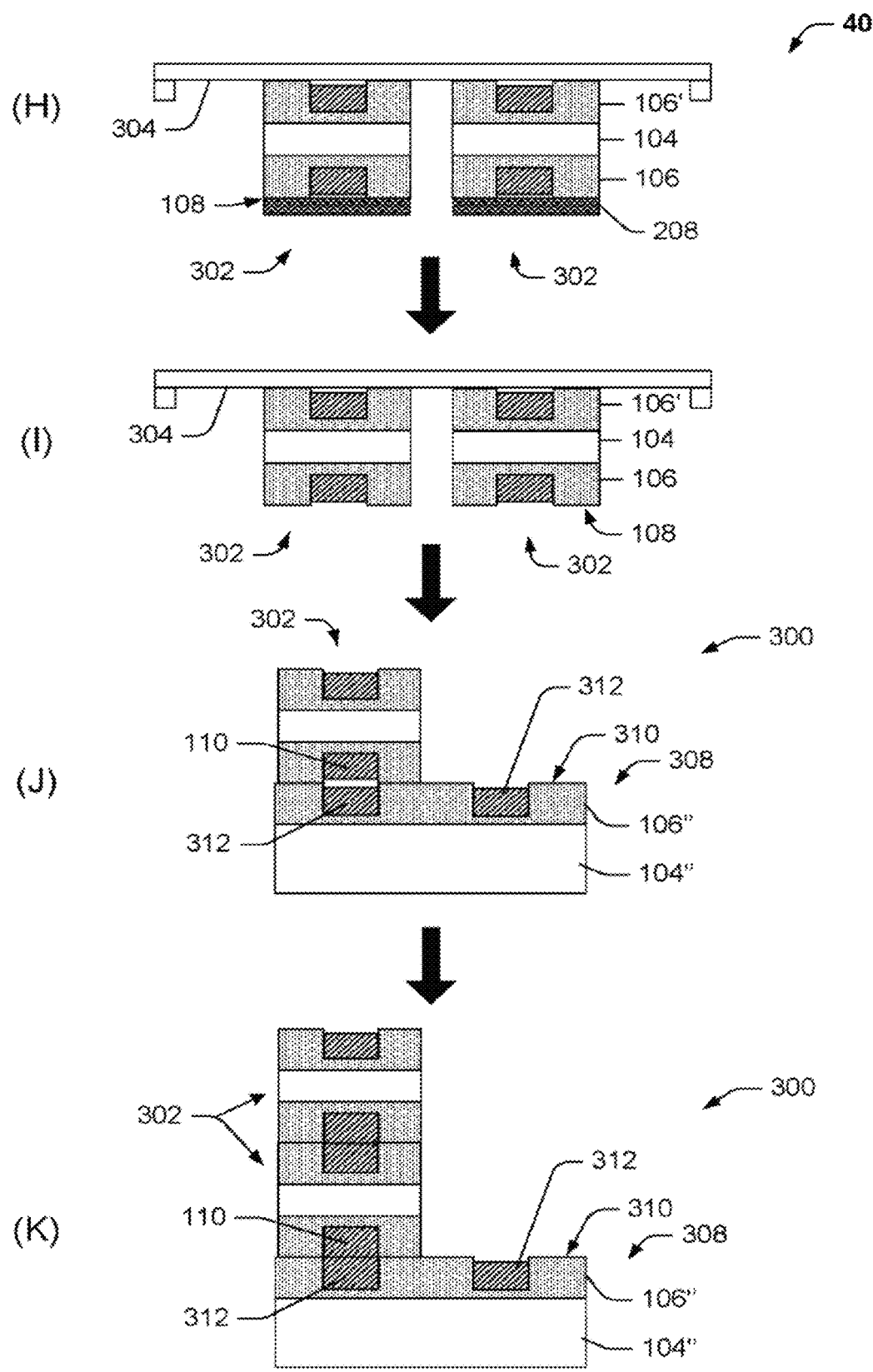

Referring to FIGS. 4-6, a process 400 is shown, where a bare silicon sacrificial handle wafer 114 can be bonded to the device wafer 102, without an insulating layer 118, for example. As shown in FIG. 4, at block A, the process 400 includes providing a device wafer 102 (e.g., wafer, substrate, die, etc.), which may be formed as discussed above, to include a base substrate 104 and an insulating or dielectric layer 106.

As shown at block A, a bonding surface 108 of the device wafer 102 can include conductive features 110. A damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. In some examples, as discussed above, a barrier layer 112 (not shown) may be deposited in the cavities for the conductive features 110 prior to depositing the material of the conductive features 110, such that the barrier layer 112 is disposed between the conductive features 110 and the insulating layer 106.

After the conductive features 110 are formed, the exposed surface of the device wafer 102, including the insulating layer 106 and the conductive features 110 can be planarized (e.g., via CMP) to form a flat bonding surface 108. Forming the bonding surface 108 includes finishing the surface 108 to meet dielectric roughness specifications and metallic layer (e.g., copper, etc.) recess specifications, to prepare the surface 108 for direct bonding.

After preparation, the first bonding surface 108 of the device wafer 102 may be bonded to a handle wafer 114 for fabrication of the second (i.e., back side) bonding surface 202. In an implementation, the handle wafer 114 comprises a silicon substrate, or the like. As shown at block A, the bonding surface 116 of the handle wafer 114 is planarized (using CMP, or the like) to achieve a highly planar surface, for a reliable direct bond with the device wafer 102. In an embodiment, the bonding surface 116 of the handle wafer 114 may be prepared with piranha etch (e.g., sulfuric acid and hydrogen peroxide). Additionally or alternatively, the bonding surface 116 of the handle wafer 114 may have a thin oxide layer, such as may be provided by a thermal oxidation process, rather than the oxide deposition process described above. Such a thin oxide layer may be less than 10 nm. In an embodiment, the bonding surface 108 may be plasma activated in preparation for bonding.

As shown at block B, the process 400 includes bonding the handle wafer 114 to the device wafer 102, by directly bonding the bonding surface 116 of the handle 114 to the bonding surface 108 of the device wafer 102, without the use of adhesive. In some examples, the bonding is performed at ambient or "room temperature" (e.g., less than 90° C.) conditions. In other examples, the bonded assembly may be heat annealed to strengthen the bond. The added sacrificial handle 114 provides mechanical support for very thin active dies (e.g., <<50 um). The handle 114 can also preserve a DBI metallic layer (e.g., copper) during high temperature processing, for instance, approximately 300 degrees C. for 2 hours, or the like.

As shown at block C, prior to forming and polishing the second bonding surface 202, the base layer 104 may be thinned, and any through silicon vias (TSVs) exposed. By using direct bonding to attach the handle wafer 114 to the device wafer 102, very precise thinning of the device wafer 102 can be achieved, and the bonded pair can be processed at temperatures above 250 C.

Referring to FIG. 5, as shown at block D, with the handle wafer 114 in place, the second bonding surface 202 on the back side of the device wafer 102 can then be deposited, formed, and finished to meet maximum dielectric roughness specifications and metallic layer (e.g., copper, etc.) recess specifications with minimal surface topology variance, as described above. For instance, an insulating layer 106' can be deposited onto the back side of the device wafer 102, and conductive features 110' embedded therein, if desired. The second bonding surface 202 including the insulating layer 106' (and the conductive features 110') is planarized in preparation for direct bonding.

At block E, a temporary carrier 204 may be attached to the second bonding surface 202, for instance with a temporary adhesive 206, or the like.

As shown at block F, the handle wafer 114 can be subsequently thinned and selectively removed using a variety of techniques, including but not limited to back grinding, touch CMP, dry etching, and wet chemical etching, or a combination thereof. In some examples, a very thin layer of oxide may be removed with the handle wafer 114. For instance, the thin layer of oxide may be part of the handle wafer 114 when it is bonded to the first bonding surface, as discussed above. The first bonding surface 108, including the insulating layer 106 and any conductive layers (such as conductive features 110, for example) is revealed when the handle wafer 114 is removed. In various examples, the first bonding surface 108 may be ready for direct bonding without further processing such as CMP, for instance. In other examples, some preparation steps (e.g., polishing, cleaning, rinsing, activation, etc.) may be performed prior to bonding.

In some cases one or more protective coatings 208 and/or 306 may be applied to the polished first 108 or second 202 bonding surfaces for protection during processing, as described above. In one example, as shown at block F, the protective coatings 208 and/or 306 may be applied to the exposed first bonding surface 108 after the handle wafer 114 is removed.

As shown at block G, after both sides of the device wafer 102 are completed, the temporary carrier 204 and temporary bonding material 206 can be removed. At block H (see FIG. 6), the finished double-sided device wafer 102 may be mounted to a dicing tape 304 on a frame and singulated to form a quantity of double-sided dies 302, using plasma dicing, saw dicing, stealth dicing, or other techniques. Optionally, the dies 302 may be transferred to a grip ring in preparation for bonding. In an implementation, the dies 302 may be cleaned (or undergo other processing) while mounted on the tape 304 held in the dicing frame or the grip ring.

In some cases, the handle wafer 114 may not have been removed in a previous process step, and may be diced with the thin wafer and used for handling the dies 302 at this process step. In those cases, the diced handle 114 may be removed from multiple dies 302 in a batch process, or the like. For instance, a wet etch may be used to remove the handle 114, with the addition of a light touch polish of the bonding surface 108 if desired. In alternate embodiments, the diced handle 114 may remain bonded to some of the dies 302 to add height to the dies 302, if desired, or for other process purposes.

As discussed above, more than one type of protective layer (e.g., 208 and/or 306) may be applied to the bonding surface(s) 108 and/or 202 prior to or after singulation. For example, a first hydrophobic protective coating 208 and an overlaying hydrophilic protective coating 306, as well as one or more other protective coatings may be applied to the bonding surface(s) 108 and/or 202. As discussed above, particles and debris from singulation may be carried off with the removal of one or more of the protective coatings (e.g., the hydrophilic layer 306). In some cases, the hydrophobic layer 208 may temporarily remain on the dies 302 to protect the surface(s) 108 and/or 202 during subsequent processing or storage. However, the hydrophobic layer 208 (or any remaining protective coatings) can be removed prior to bonding, as shown at block I.

At block J, the process 100 includes stacking and bonding the singulated dies 302 to a prepared host die, wafer, substrate 308, or the like, using a pick and place device, or the like. Preparing the host substrate 308 can include depositing and forming a bonding surface 310 on a surface of the substrate 308, including providing conductive features 312, or the like, and forming a highly planar surface topology, comprising an insulating layer 106" over a base layer 104", as described above.

In some cases, the bonding surface 108 and/or the bonding surface 310 may be plasma treated to enhance direct bonding. Additional dies 302 may be stacked and bonded to the substrate 308 or to the previously bonded die 302, as shown at block K. Further, once the die(s) 302 are stacked and bonded as desired, the assembly 300 may be heat annealed to further bond the conductive features 110 and 312.

The advantages of using a bare silicon wafer as the handle 114 will be apparent to one having skill in the art. For instance, the handle wafer 114 can be directly bonded to a surface prepared for direct bonding such as an oxide surface, or a DBI® (e.g., hybrid) surface. When removing the handle wafer 114 with a combination of processes, such as, but not limited to back grinding, CMP, dry etching, or wet chemical etching, or a combination thereof, the handle wafer 114 can be completely removed by various techniques with a high degree of selectivity, since there is only one material (e.g., silicon) involved.

As discussed, the bare silicon handle wafer 114 can be particularly useful for preparing and handling thin dies 302 for bonding processes. For example, a device wafer 102 prepared for DBI® (e.g., hybrid) bonding can be directly bonded to a bare silicon handle wafer 114 and subsequently be thinned to an active silicon thickness below for example, 1 Oum. This bonded wafer pair can be processed on the backside of the device wafer 102 to prepare the second DBI® (e.g., hybrid) surface for bonding.

If desired, the dicing street area of the device wafer 102 can be patterned and etched down to or into the handle wafer 114 to achieve uniform smooth die 302 edges for bonding. The handle wafer 114 may then be thinned to a desired thickness for dicing and handling required for bonding of the dies 302. After the dies 302 have been bonded to a second device wafer 308 (or the like), the handle 114 can be selectively removed by, for example, wet chemical etching. A wet etch can be selected, for example TMAH, which has a very high degree of selectivity between silicon, oxide, copper, and barrier metal so that the silicon handle 114 can be removed without damaging the bonding surface 108 or 202. If necessary, a light CMP process can be employed after etching to smooth the surface 108 and/or 202 of the die 302 for bonding of a second die 302. This process can be repeated to achieve a stack of device dies 302 on a device wafer 308 (or the like).

Some advantages of bonding a handle wafer 114 with an oxide layer 118 or a bare silicon handle wafer 114 to the device wafer 102, using a direct bonding technique without adhesive, include: the handle 114 accommodates accurate thinning of the device wafer 102; the handle 114 accommodates high temperature processing of the device wafer 102; the handle 114 provides better thermal conduction between the handle 114 and the device wafer 102 compared to an adhesive bonded handle wafer; the handle 114 accommodates normal handling of wafers 102 for processing (as opposed to transparent handle wafers which may require special handling); and the handle 114 provides handle technology which is clean and free of mobile ion-containing materials or other contaminants (such as with glass wafers).

Figure 7:
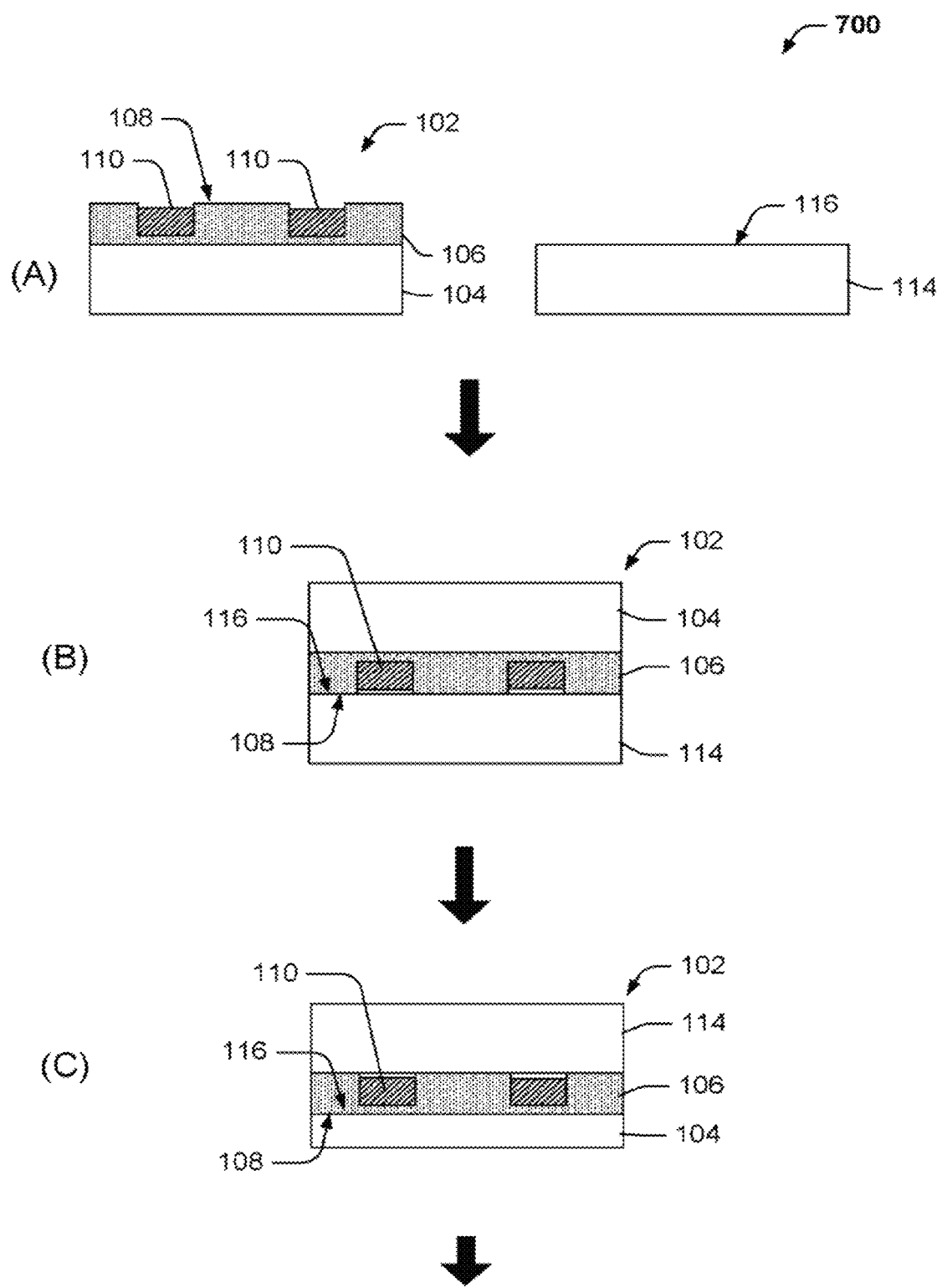
FIGS. 7-9 show an example graphical flow diagram illustrating an additional example process using a handle wafer in preparing dies for bonding, according to an embodiment.
Figure 8:
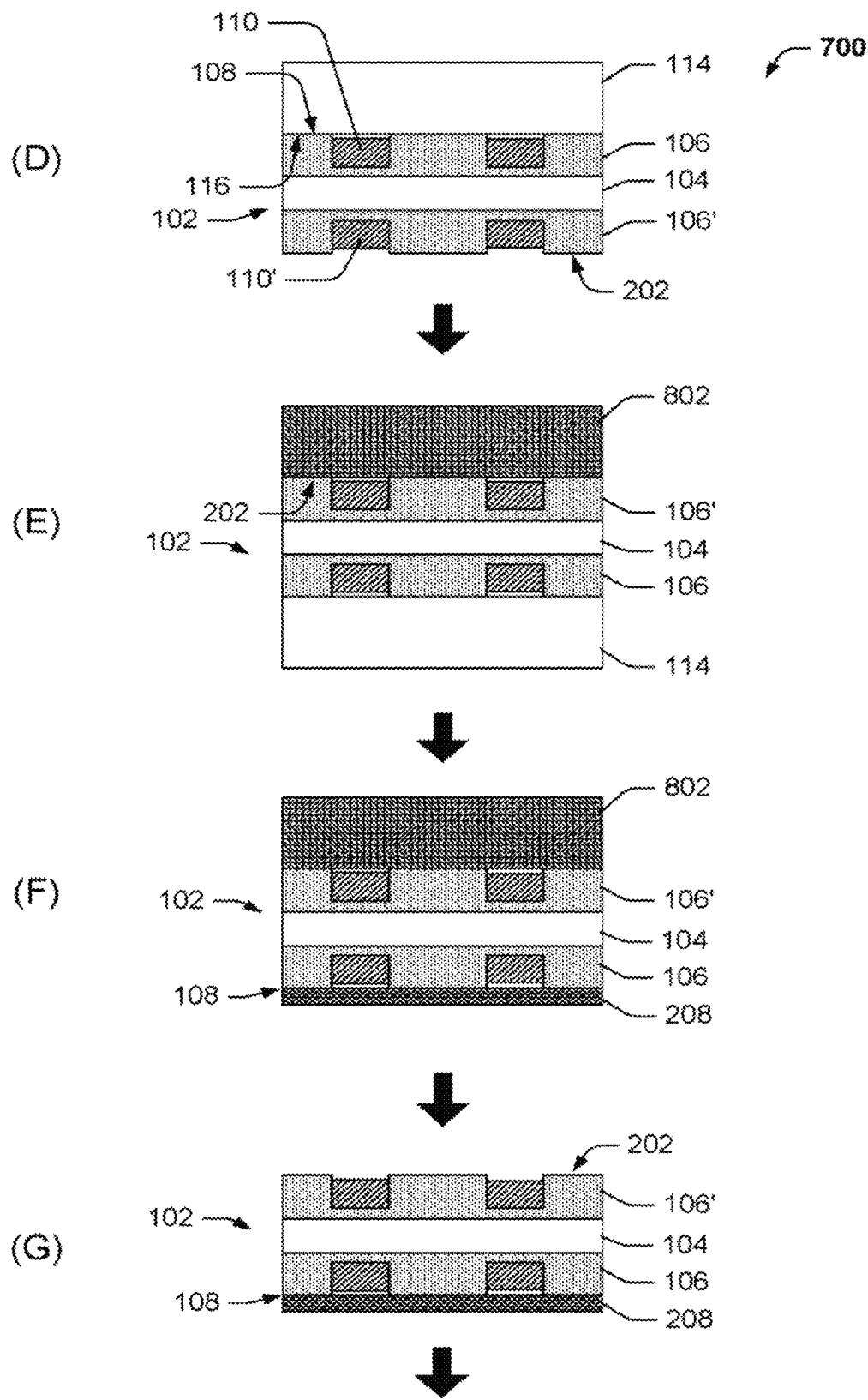
Figure 9:
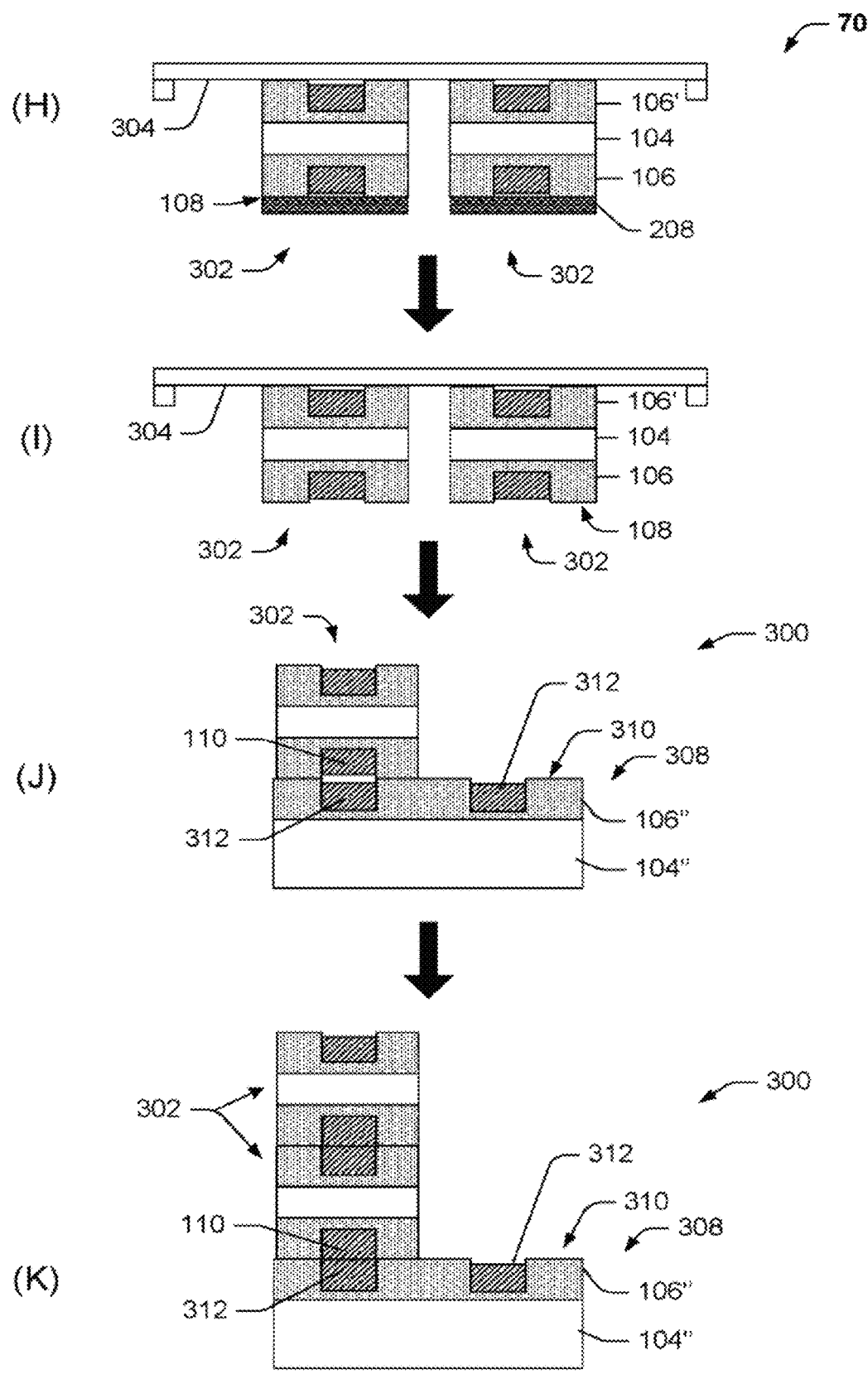

Referring to FIGS. 7-9, a process 700 is shown, where a bare silicon sacrificial handle wafer 114 can be bonded to the device wafer 102, without an insulating layer 118, for example. In an implementation, the device wafer 102 may be mounted to a process chuck for some of the process steps. As shown in FIG. 7, at block A, the process 700 includes providing a device wafer 102 (e.g., wafer, substrate, die, etc.), which may be formed as discussed above, to include a base substrate 104 and an insulating or dielectric layer 106.

As shown at block A, the bonding surface 108 of the device wafer 102 can include conductive features 110, as discussed above, which may also include a barrier layer 112 (not shown) between the conductive features 110 and the insulating layer 106.

After bonding surface 108 preparation, the first bonding surface 108 of the device wafer 102 may be bonded to a handle wafer 114 (for example, a bare silicon wafer, silicon with a thin thermal oxide or a thin oxide formed through a plasma or wet chemical process, or the like) for fabrication of the second (i.e., back side) bonding surface 202. In an implementation, the handle wafer 114 is planarized (using CMP, or the like) to achieve a highly planar surface, and may be prepared with piranha etch (e.g., sulfuric acid and hydrogen peroxide, for instance). In an embodiment, the bonding surface 108 may be plasma activated in preparation for bonding.

As shown at block B, the process 700 includes bonding the handle wafer 114 to the device wafer 102, by directly bonding the bonding surface 116 of the handle 114 to the bonding surface 108 of the device wafer 102, without the use of adhesive. In some examples, the bonding is performed at ambient or "room temperature" (e.g., less than 90° C.) conditions. In other examples, the bonded assembly may be heat annealed to strengthen the bond.

As shown at block C, prior to forming and polishing the second bonding surface 202, the base layer 104 may be thinned, and any through silicon vias (TSVs) exposed and planarized. By using direct bonding to attach the handle wafer 114 to the device wafer 102, very precise thinning of the device wafer 102 can be achieved, and the bonded pair can be processed at temperatures above 250 C.

Referring to FIG. 8, as shown at block D, with the handle wafer 114 in place, the second bonding surface 202 on the back side of the device wafer 102 can be deposited, formed, and finished to meet maximum dielectric roughness specifications and metallic layer (e.g., copper, etc.) recess specifications with minimal surface topology variance, as described above. For instance, an insulating layer 106' can be deposited onto the back side of the device wafer 102, and conductive features 110' embedded therein, if desired. The second bonding surface 202 including the insulating layer 106' (and the conductive features 110') is planarized in preparation for direct bonding.

At block E, the device wafer 102 may be mounted to a process chuck 802 (or the like), such as a vacuum chuck or electrostatic chuck.

As shown at block F, the handle wafer 114 can be subsequently thinned and selectively removed using a variety of techniques, including but not limited to back grinding, touch CMP, dry etching, and wet chemical etching, or a combination thereof. The first bonding surface 108, including the insulating layer 106 and any conductive layers (such as conductive features 110, for example) is revealed when the handle wafer 114 is removed. In various examples, the first bonding surface 108 may be ready for direct bonding without further processing as what little oxide remains may be within the roughness specification desired. In other examples, some preparation steps (e.g., polishing, cleaning, rinsing, activation, etc.) may be performed prior to bonding.

In some cases one or more protective coatings 208 and/or 306 may be applied to the polished first 108 or second 202 bonding surfaces for protection during processing, as described above. In one example, referring to block F, the protective coatings 208 and/or 306 (not shown) may be applied to the exposed first bonding surface 108 after the handle wafer 114 is removed.

As shown at block G, the device wafer 102 is released from the process chuck 802 when both sides of the device wafer 102 are completed and (at block H, see FIG. 9) as the finished double-sided device wafer 102 is mounted to a dicing tape 304 held in a dicing frame. The wafer is then singulated to form a quantity of double-sided dies 302, using plasma dicing, saw dicing, stealth dicing, or other techniques. Optionally, the dies 302 may be transferred to a dicing tape held in a grip ring in preparation for bonding. In an implementation, the dies 302 may be cleaned (or undergo other processing) while mounted to a dicing tape 304 held in a dicing frame or a grip ring.

In some cases, the handle wafer 114 may not have been removed in a previous process step, and may be used for handling the dies 302 at this process step. In those cases, the handle 114 may be removed from multiple dies 302 in a batch process, or the like. For instance, a wet etch may be used to remove the handle 114, with the addition of a light touch polish of the bonding surface 108 if desired.

As discussed above, more than one type of protective layer (e.g., 208 and/or 306) may be applied to the bonding surface(s) 108 and/or 202 prior to or after singulation. For example, a first hydrophobic protective coating 208 and an overlaying hydrophilic protective coating 306, as well as one or more other protective coatings may be applied to the bonding surface(s) 108 and/or 202. As discussed above, particles and debris from singulation may be carried off with the removal of one or more of the protective coatings (e.g., the hydrophilic layer 306). In some cases, the hydrophobic layer 208 may temporarily remain on the dies 302 to protect the surface(s) 108 and/or 202 during subsequent processing or storage. However, the hydrophobic layer 208 (or any remaining protective coatings) can be removed prior to bonding, as shown at block I.

At block J, the process 100 includes stacking and bonding the singulated dies 302 to a prepared host die, wafer, substrate 308, or the like, using a pick and place device, or the like. Preparing the host substrate 308 can include depositing and forming a bonding surface 310 on a surface of the substrate 308, including providing conductive features 312, or the like, and forming a highly planar surface topology, comprising an insulating layer 106" over a base layer 104", as described above.

In some cases, the bonding surface 108 and/or the bonding surface 310 may be plasma treated to enhance direct bonding. Additional dies 302 may be stacked and bonded to the substrate 308 or to the previously bonded die 302, as shown at block K. Further, once the die(s) 302 are stacked and bonded as desired, the assembly 300 may be heat annealed to further bond the conductive features 110 and 312.

Figure 10:
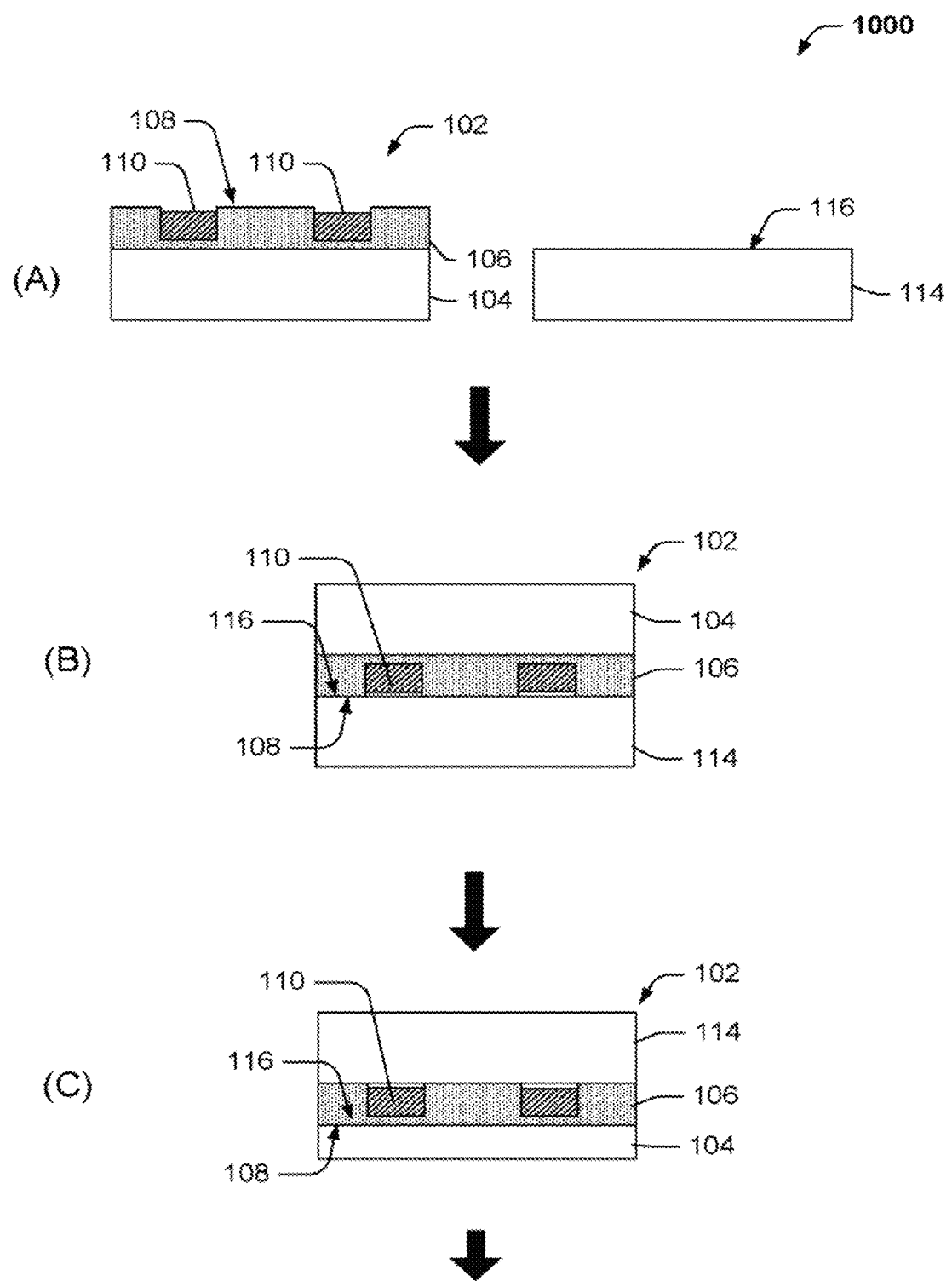
FIGS. 10-12 show an example graphical flow diagram illustrating a further example process using a handle wafer in preparing dies for bonding, according to an embodiment.
Figure 11:
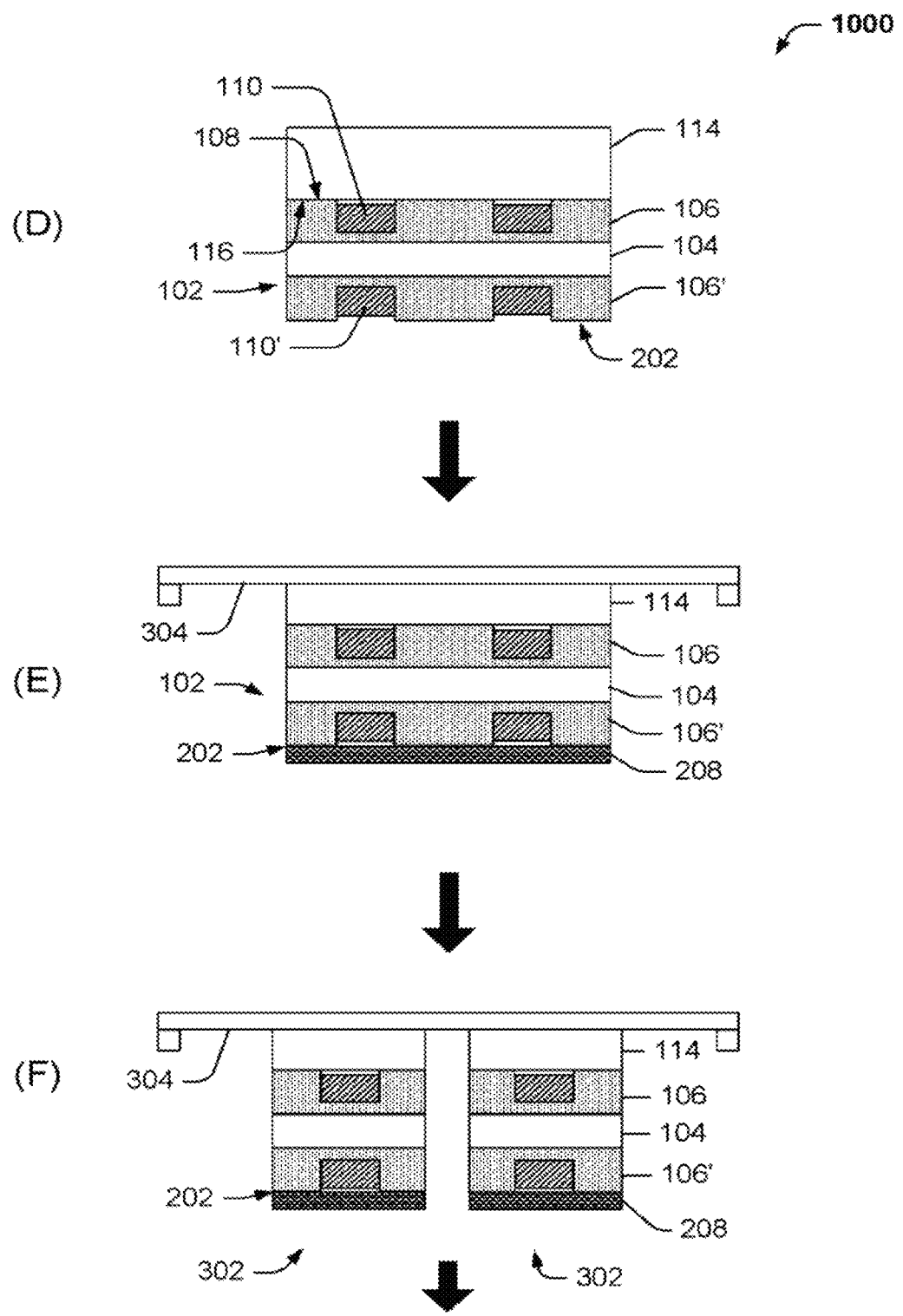
Figure 12:
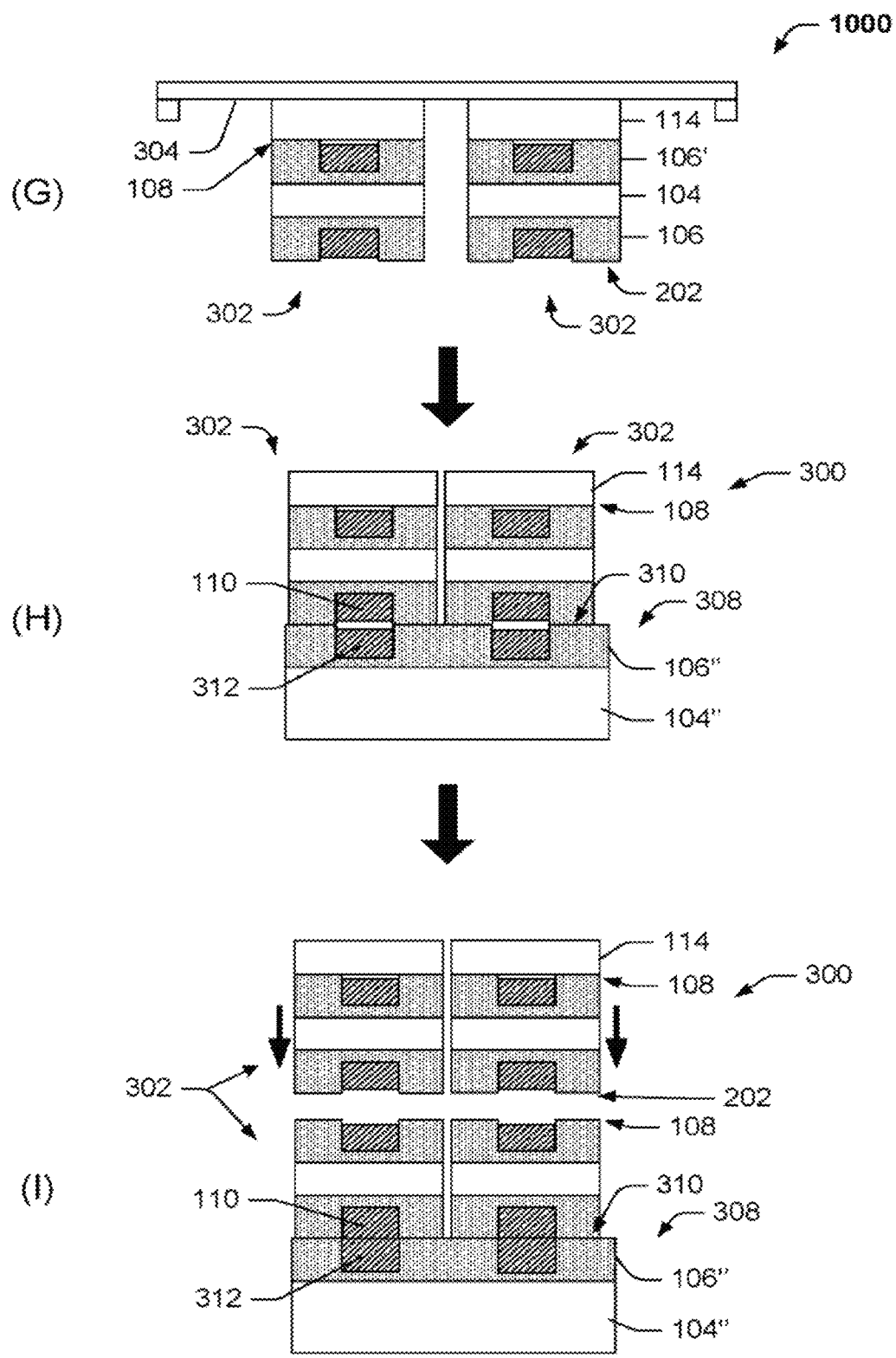

Referring to FIGS. 10-12, a simplified process 1000 is shown, where a bare silicon sacrificial handle wafer 114 is bonded to the device wafer 102, without an insulating layer 118, for example. In an implementation, no additional temporary handle or carrier is used with the device wafer 102. As shown in FIG. 10, at block A, the process 1000 includes providing a device wafer 102 (e.g., wafer, substrate, die, etc.), which may be formed as discussed above, to include a base substrate 104 and an insulating or dielectric layer 106.

As shown at block A, the bonding surface 108 of the device wafer 102 can include conductive features 110, as discussed above, which may also include a barrier layer 112 (not shown) between the conductive features 110 and the insulating layer 106.

After bonding surface 108 preparation, the first bonding surface 108 of the device wafer 102 may be bonded to a handle wafer 114 (for example, a bare silicon wafer, or the like) for fabrication of the second (i.e., back side) bonding surface 202. In an implementation, the handle wafer 114 is planarized (using CMP, or the like) to achieve a highly planar surface, and may be prepared with piranha etch (e.g., sulfuric acid and hydrogen peroxide, for instance). Additionally or alternatively, the bonding surface 116 of the handle wafer 114 may have a thin oxide layer, such as may be provided by a thermal oxidation process, rather than the oxide deposition process described above. In an embodiment, the bonding surface 108 may be plasma activated in preparation for bonding.

As shown at block B, the process 1000 includes bonding the handle wafer 114 to the device wafer 102, by directly bonding the bonding surface 116 of the handle 114 to the bonding surface 108 of the device wafer 102, without the use of adhesive. In some examples, the bonding is performed at ambient or "room temperature" (e.g., less than 90° C.) conditions. In other examples, the bonded assembly may be heat annealed to strengthen the bond.

As shown at block C, prior to forming and polishing the second bonding surface 202, the base layer 104 may be thinned, and any through silicon vias (TSVs) exposed and planarized. By using direct bonding to attach the handle wafer 114 to the device wafer 102, very precise thinning of the device wafer 102 can be achieved, and the bonded pair can be processed at temperatures above 250 C.

Referring to FIG. 11, as shown at block D, with the handle wafer 114 in place, the second bonding surface 202 on the back side of the device wafer 102 can be deposited, formed, and finished to meet maximum dielectric roughness specifications and metallic layer (e.g., copper, etc.) recess specifications with minimal surface topology variance, as described above. For instance, an insulating layer 106' can be deposited onto the back side of the device wafer 102, and conductive features 110' embedded therein, if desired. The second bonding surface 202 including the insulating layer 106' (and the conductive features 110') is planarized in preparation for direct bonding.

At block E, the silicon handle wafer 114 can be thinned if desired. For instance, if the handle 114 is intended to remain bonded to the singulated dies 302, the handle wafer 114 may be thinned to a desired height at this step or at other another step in the process 1000. In some cases one or more protective coatings 208 and/or 306 may be applied to the polished second 202 bonding surface for protection during processing, as described above.

As shown at block F, the device wafer 102 is flipped with the handle wafer 114 down and attached to the dicing tape 304 held in a dicing frame for singulation, and the dies 302 may be transferred to a dicing tape held in a grip ring in preparation for bonding. In an implementation, the dies 302 may be cleaned (or undergo other processing) while mounted to a dicing tape 304 held in the dicing frame or the grip ring.

As discussed above, more than one type of protective layer (e.g., 208 and/or 306) may be applied to the bonding surface(s) 108 and/or 202 prior to or after singulation. For example, a first hydrophobic protective coating 208 and an overlaying hydrophilic protective coating 306, as well as one or more other protective coatings may be applied to the bonding surface(s) 108 and/or 202. As discussed above, particles and debris from singulation may be carried off with the removal of one or more of the protective coatings (e.g., the hydrophilic layer 306). In some cases, the hydrophobic layer 208 may temporarily remain on the dies 302 to protect the surface(s) 108 and/or 202 during subsequent processing or storage. However, the hydrophobic layer 208 (or any remaining protective coatings) can be removed prior to bonding, as shown at block G.

At block H, the process 1000 includes stacking and bonding the singulated dies 302 to a prepared host die, wafer, substrate 308, or the like, using a pick and place device, or the like. Preparing the host substrate 308 can include depositing and forming a bonding surface 310 on a surface of the substrate 308, including providing conductive features 312, or the like, and forming a highly planar surface topology, comprising an insulating layer 106" over a base layer 104", as described above. In some cases, the bonding surface 108 and/or the bonding surface 310 may be plasma treated to enhance direct bonding.

As shown at block H, the handle 114 may be removed in a batch process from the stacked and bonded dies 302, using a wet etch, for example. In some examples, a very thin layer of oxide may be removed with the handle 114. For instance, the thin layer of oxide (<10 nm) may be part of the handle wafer 114 when it is bonded to the first bonding surface, as discussed above. A light touch polish (e.g., CMP) of the bonding surface 108 may be performed if desired. Additional dies 302 may be stacked and bonded to the substrate 308 or to the previously bonded die 302, as shown at block I. Handles 114 may be removed from each of the additional stacked dies 302 after bonding (in a batch process if desired). Alternately, some handles 114 may remain bonded to some of the dies 302 (e.g., not be removed from some of the dies 302) to add height to the dies 302, for example, if desired. Further, once the die(s) 302 are stacked and bonded as desired, the assembly 300 may be heat annealed to further bond the conductive features 110 and 312.

Figure 13:
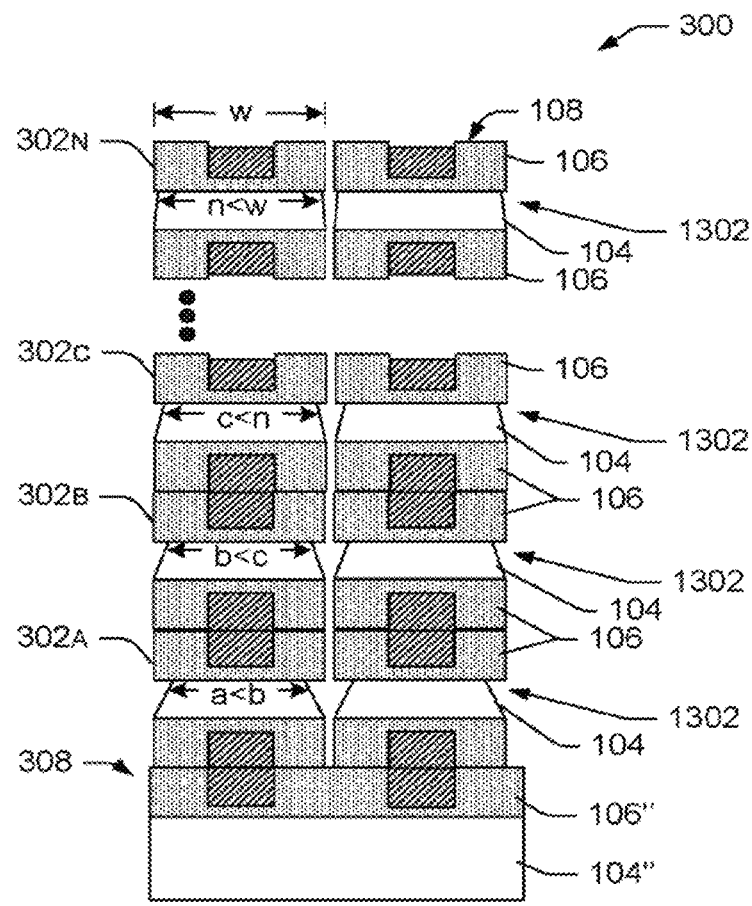
FIG. 13 illustrates an example microelectronic assembly comprised of multiple stacked and bonded microelectronic elements, according to an embodiment.

Referring to FIG. 13, an example microelectronic assembly 300 is shown, which may be formed using one or more of the processes 100, 400, 700, 1000, described above, or another process. In an embodiment, multiple dies 302 (dies 302A-302N, for example) are stacked and bonded as described at block H of process 1000. After each die 302 is bonded to the previous die 302 (or to the substrate 308) the handle 114 may be removed from the bonded die 302, prior to bonding a subsequent die 302. In various embodiments, the handle 114 may be removed using a selective wet chemical etch, or the like, in addition to other removal techniques, if applicable.

In an implementation, the use of the selective wet etch chemical(s) to remove the handle 114 can also expose other parts of the assembly 300 to the chemicals. For instance, the base layer 104 and the insulating layer 106 of one or more of the dies 302 can be exposed to the etch chemicals during the handle 114 removal steps. The selective wet etch chemicals can etch the material of the base layer 104 (e.g., silicon) to a much greater degree than the insulating layer 106 (if it etches the insulating layer 106 at all) when these layers (104 and 106) are exposed to the chemical etch. This can result in recessing 1302 of the base layer 104 of the dies 302, including the dies 302 that have previously been stacked and bonded to the assembly 300. Consequently, the dies 302 that are lower in the stack may have greater recessing 1302 due to greater exposure to the chemical etch.

For example, as shown in FIG. 13, the die 302A is bonded to the host substrate 308 first, and the handle 114 of the die 302A is removed using the chemical etch after the bonding. The base layer 104 of the die 302A may be exposed to the selective chemical etch during the removal step, resulting in some recessing 1302 of the base layer 104. The insulating layer 106 of the die 302A may also be exposed to the selective chemical etch, but may experience very little or no recessing due to the selectivity of the chemical etch. This can make the recession 1302 of the base layer 104 more visually detectible.

Once the handle 114 is removed from the die 302A and the top bonding surface 108 is exposed and prepared for bonding, the die 302B is bonded to the die 302A. The stack is once again exposed to the selective chemical etch during removal of the handle 114 of the die 302B, resulting in some recessing 1302 to the base layer 104 of the die 302B and more recessing 1302 of the base layer 104 of the die 302A. The insulating layers 106 of the dies 302A and 302B experience very little to no recessing due to the selectivity of the chemical etch.

As each subsequent die 302C-302N is added to the stack, the handle 114 of each is removed, and the stack is exposed to the selective etch chemical(s). The resulting uneven profile signature on the assembly 300 may appear as illustrated in FIG. 13, where many or all of the base layers 104 have experienced some recession 1302 (e.g., at least a portion of the base layer 104 has a narrower width than the insulating layers 106), while the insulating layers 106 have experienced very little or no recession. Also, the lower dies 302 (such as die 302A) may show greater recession 1302 than the upper dies 302 (such as die 302N) of the assembly 300.

This results in a profile edge that is jagged and is not constant or even, but where the narrowest width (n) of the base layer 104 of a die 302 (such as die 302N, for example) at a first end of the stack of dies 302 has a greater dimension than the narrowest width (a) of the base layer 104 of a die 302 (such as die 302A, for example) at an opposite end of the stack of dies. For example, the narrowest width of the base layer 104 of each die 302 of the stack of bonded dies 302 has an increasingly smaller dimension (n, c, b, a) from the first end of the stack (width=n) to the opposite end of the stack (width=a). While the dimension (w) of the insulating layer 106 of each of the dies 302 is substantially constant, and is greater than the narrowest width (n) of the base layer 104 with the greatest dimension of narrowest width.

In various embodiments, some process steps may be modified or eliminated, in comparison to the process steps described herein.

The techniques, components, and devices described herein are not limited to the illustrations of FIGS. 1-13, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method comprising:
preparing a bonding surface of a first bonding layer on a substrate;
direct bonding a first side of a first microelectronic component to the bonding surface using a direct non-adhesive technique to form at least a portion of a structure;
while the substrate supports the first microelectronic component, forming a second bonding layer on a surface on a second side of the of the first microelectronic component, wherein the second side is opposite the first side;
hybrid bonding a second microelectronic component to the second bonding layer;
after hybrid bonding the second microelectronic component to the second bonding layer, removing at least the substrate by grinding or polishing the substrate; and
singulating the structure to form a plurality of microelectronic units, wherein a first microelectronic unit of the plurality of microelectronic units comprises the first microelectronic component.

2. The method of claim 1, wherein the second bonding layer comprises a first conductive feature and a first dielectric region, wherein the second microelectronic component comprises a second conductive feature and a second dielectric region, and wherein hybrid bonding the second microelectronic component to the bonding layer comprises directly bonding the first and second conductive features and directly bonding the first and second dielectric regions using the direct non-adhesive technique.

3. The method of claim 1, wherein preparing the bonding surface of the substrate comprises a plasma activating bonding surface.

4. The method of claim 1, wherein removing the substrate by grinding or polishing the substrate comprises exposing the first side of the first microelectronic component.

5. The method of claim 4, further comprising:
after removing the substrate, processing the exposed first side of the microelectronic component to form a second bonding surface over the exposed first side.

6. The method of claim 5, wherein processing the exposed first side of the microelectronic component to form the second bonding surface comprises polishing the first side.

7. The method of claim 1, further comprising:
before forming the bonding layer over the surface, planarizing the second side of the first microelectronic component.

8. The method of claim 1, further comprising:
before forming the bonding layer over the surface, polishing the second side of the first microelectronic component to form the surface.

9. The method of claim 1, further comprising:
before forming the bonding layer over the surface, forming more than one protective layer over the second side of the first microelectronic component.

10. The method of claim 1, further comprising singulating to form a plurality of microelectronic units, a first microelectronic unit of the plurality of microelectronic units comprising the first and second microelectronic components.

11. A method comprising:
direct bonding a first side of a first microelectronic component to a first bonding layer on a substrate using a direct non-adhesive technique to form at least a portion of a structure;
while the substrate supports the first microelectronic component, planarizing a second side of the first microelectronic component and providing a second bonding layer on the second side, wherein the second side faces away from the substrate;
hybrid bonding a second microelectronic component to the second bonding layer without an adhesive, wherein the second bonding layer on the first microelectronic component comprises a first conductive feature and the second microelectronic component comprises a second conductive feature directly bonded to the first conductive feature;
removing at least the substrate by grinding or polishing the substrate; and
singulating the structure to form a plurality of microelectronic units, wherein a first microelectronic unit of the plurality of microelectronic units comprises the first microelectronic component.

12. The method of claim 11, further comprising:
after removing the substrate, forming a bonding surface on the first side of the first microelectronic component.

13. The method of claim 12, wherein forming the bonding surface on the first side of the microelectronic component comprises polishing the first side of the microelectronic component.

14. The method of claim 11, further comprising:
while the substrate supports the first microelectronic component, forming more than one type of protective layer on the second side of the first microelectronic component.

15. The method of claim 11, wherein direct bonding the first side of the first microelectronic component to the substrate comprises direct bonding the first side of the first microelectronic component to a bonding surface of the first bonding layer on the substrate, the method further comprising:
before direct bonding the first side of the first microelectronic component to a bonding surface of the first bonding layer on the substrate, plasma activating the bonding surface.

16. A method comprising:
providing a structure comprising a first side of a first microelectronic component directly bonded to a first bonding layer on a substrate using a direct non-adhesive technique;
while the substrate supports the first microelectronic component, processing the first microelectronic component to form a second bonding layer on a second side of the first microelectronic component, wherein the second bonding layer faces away from the substrate;
hybrid bonding a second microelectronic components to the second bonding layer;

removing at least the substrate to expose the first side of the first microelectronic component, the removing comprising grinding or polishing the substrate;

polishing the first side of the first microelectronic component; and singulating the structure to form a plurality of microelectronic units, wherein a first microelectronic unit of the plurality of microelectronic units comprises the first microelectronic component.

17. The method of claim 16, wherein removing the substrate comprises removing the substrate by grinding the substrate.

18. The method of claim 16, wherein the second bonding layer comprises a first conductive feature and the second microelectronic component comprises a second conductive feature and wherein the first and second conductive features are directly bonded to each other.

19. The method of claim 16, wherein processing the first microelectronic component comprises applying more than one type of protective coating over the second side of the first microelectronic component.

20. The method of claim 16, wherein processing the first microelectronic component comprises planarizing the first microelectronic component.

* * * * *